(12) United States Patent
Xie et al.

(10) Patent No.: US 10,872,809 B2
(45) Date of Patent: Dec. 22, 2020

(54) CONTACT STRUCTURES FOR INTEGRATED CIRCUIT PRODUCTS

(71) Applicant: GLOBALFOUNDRIES Inc., Grand Cayman (KY)

(72) Inventors: Ruilong Xie, Niskayuna, NY (US); Lars W. Liebmann, Mechanicville, NY (US); Balasubramanian Pranatharthi Haran, Watervliet, NY (US); Veeraraghavan Basker, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/579,035

(22) Filed: Sep. 23, 2019

(65) Prior Publication Data
US 2020/0020575 A1 Jan. 16, 2020

Related U.S. Application Data

(63) Continuation of application No. 15/837,671, filed on Dec. 11, 2017, now Pat. No. 10,497,612.

(51) Int. Cl.
*H01L 29/423* (2006.01)
*H01L 21/768* (2006.01)
*H01L 21/321* (2006.01)

(52) U.S. Cl.
CPC ...... *H01L 21/76819* (2013.01); *H01L 21/321* (2013.01); *H01L 21/76877* (2013.01); *H01L 29/42376* (2013.01)

(58) Field of Classification Search
CPC ............ H01L 21/76819; H01L 21/321; H01L 21/76877
See application file for complete search history.

(56) References Cited

U.S. PATENT DOCUMENTS

| | | | |
|---|---|---|---|
| 9,147,576 | B2 | 9/2015 | Horak et al. |
| 9,691,897 | B2 | 6/2017 | Xie et al. |
| 9,824,921 | B1 | 11/2017 | Labonte et al. |
| 2014/0312397 | A1 | 10/2014 | Cheng et al. |
| 2016/0358908 | A1 | 12/2016 | Xie et al. |
| 2017/0054004 | A1 | 2/2017 | Cheng et al. |

OTHER PUBLICATIONS

Translation of Examination Report from corresponding Taiwan application No. 107139914 dated Jul. 29, 2019.

*Primary Examiner* — Stephen W Smoot
*Assistant Examiner* — Vicki B. Booker
(74) *Attorney, Agent, or Firm* — Francois Pagette; Hoffman Warnick LLC

(57) ABSTRACT

One illustrative transistor device disclosed herein includes a gate structure positioned above at least an active region, wherein the gate structure has an axial length in a direction corresponding to a gate width direction of the transistor device. In this example, a first portion of the axial length of the gate structure has a first upper surface and a second portion of the axial length of the gate structure has a second upper surface, wherein the first upper surface is positioned at a level that is above a level of the second upper surface. The device also includes a gate contact structure that contacts the first upper surface of the gate structure.

20 Claims, 25 Drawing Sheets

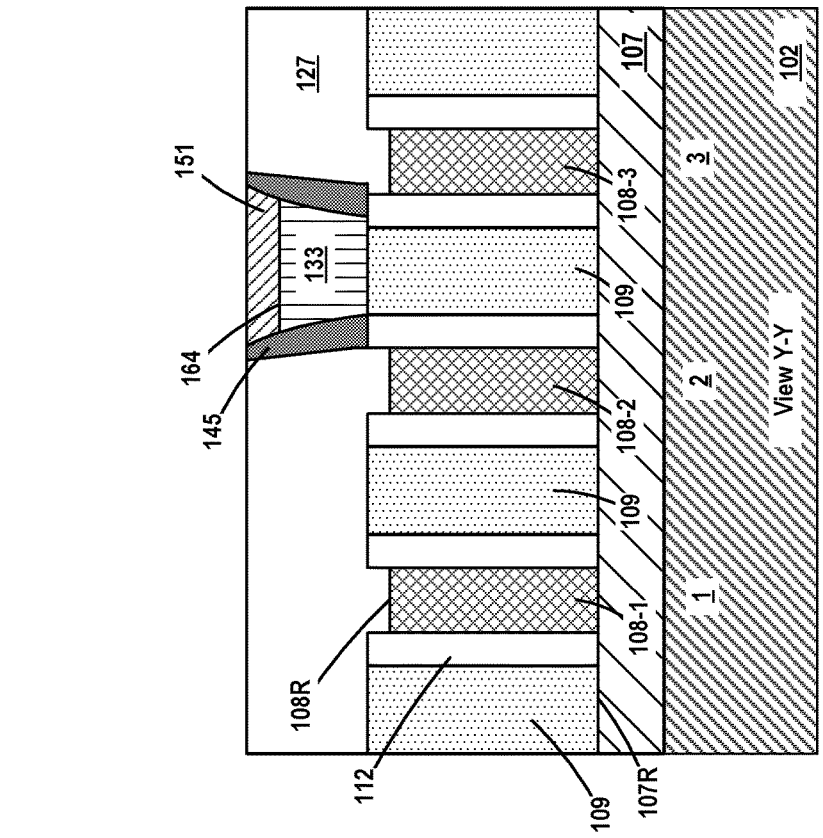
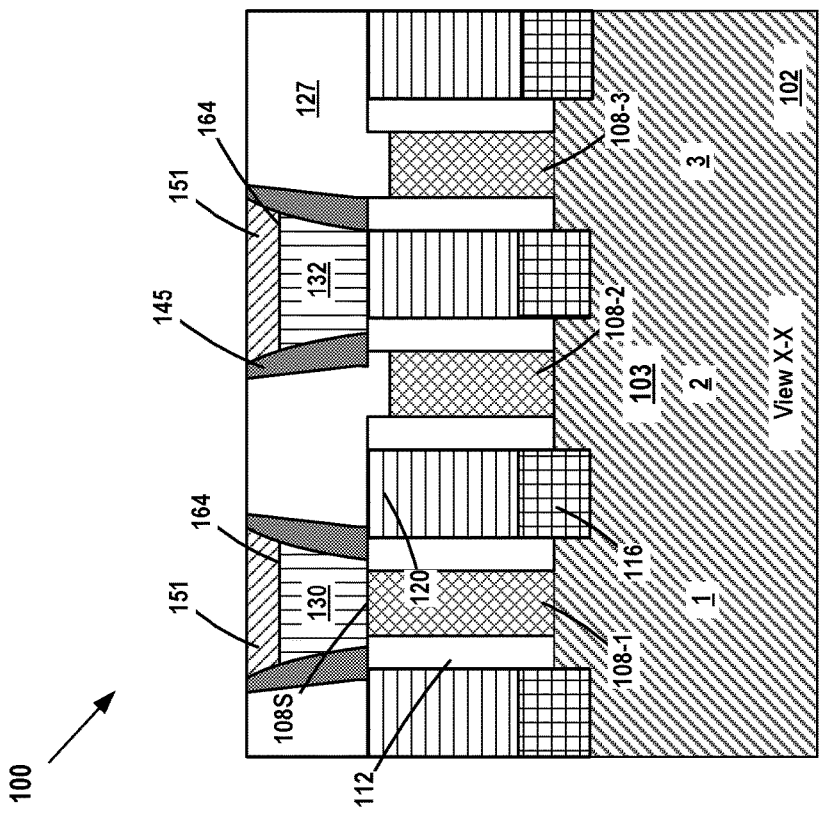
Fig. 20

CONTACT STRUCTURES FOR INTEGRATED CIRCUIT PRODUCTS

BACKGROUND OF THE INVENTION

1. Field of the Invention

The present disclosure generally relates to the fabrication of integrated circuits, and, more particularly, to various novel methods of forming contact structures on integrated circuit (IC) products and various novel IC products. As one example, the methods disclosed herein may be employed when forming device level contacts, such as source/drain contact structures and gate contact structures, on IC products.

2. Description of the Related Art

In modern integrated circuits, such as microprocessors, storage devices and the like, a very large number of circuit elements, especially field effect transistors (FETs), are formed and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

Typically, due to the large number of semiconductor devices (i.e., circuit elements such as transistors, resistors, capacitors, etc.) and the required complex layout of modern integrated circuits, the electrical connections or "wiring arrangement" for the individual semiconductor devices, e.g., transistors, capacitors, etc., cannot be established within the same device level on which the semiconductor devices are manufactured. Accordingly, the various electrical connections that constitute the overall wiring pattern for the IC product are formed in a metallization system that comprises a plurality of stacked "metallization layers" that are formed above the device level of the product. These metallization layers are typically comprised of layers of insulating material with conductive metal lines or conductive vias formed in the layers of insulating material. Generally, the conductive lines provide the intra-level electrical connections, while the conductive vias provide the inter-level connections or vertical connections between different levels of the conductive lines. These conductive lines and conductive vias may be comprised of a variety of different materials, e.g., copper, tungsten, aluminum, etc. (with appropriate barrier layers). The first metallization layer in an integrated circuit product is typically referred to as the "M1" layer. Normally, a plurality of conductive vias (typically referred to as "V0" vias) are used to establish electrical connection between the M1 layer and lower level conductive structures that are generally referred to as device-level contacts (explained more fully below). In some more advanced devices, another metallization layer comprised of conductive lines (sometimes called the "M0" layer) is formed between the device level contacts and the V0 vias.

There are also device level contacts positioned below the lowermost layer of the metallization system on an IC product. For example, such device level contacts include a plurality of so-called "CA contact" structures for establishing electrical connection to the source/drain regions of a transistor device, and a gate contact structure, which is sometimes referred to as a "CB contact" structure, for establishing electrical connection to the gate structure of the transistor device. The CB gate contact is typically positioned vertically above isolation material that surrounds the transistor device, i.e., the CB gate contact is typically not positioned above the active region, but it may be in some advanced architectures.

The CB gate contact is typically positioned above the isolation region so as to avoid or reduce the chances of creating an electrical short between the CB gate contact and the conductive source/drain structures (e.g., trench silicide (TS) structures) formed in the source/drain regions of the transistor adjacent the gate structure of the transistor. Insulating material, typically in the form of at least a sidewall spacer, is positioned between the gate structure and the conductive source/drain structures. Typically, there are also design rules that set a minimum spacing that must be maintained between the CB gate contact and the conductive source/drain structures in an attempt to prevent such electrical shorts. Unfortunately, there is an area penalty associated with the requirement that the CB gate contact only be positioned above the isolation region.

Efforts have been made to create process flows whereby the CB contact is formed entirely over the active area. Unfortunately, such process flows typically involve many additional process steps and may require the use of new materials. Such complex processing also inherently increases the chances of reduced product yields. What is needed is a method for forming the CB gate contact so as to conserve valuable plot space on an IC product that is less complex than the processes whereby the CB contact is formed entirely over the active region. What is further needed is a less complex process flow for forming the CB contact entirely over the active area. Some IC products include CB contacts that are formed entirely over the active region as well as other CB contacts that are formed above isolation material. What is also needed is an efficient process flow for forming all of these device level contacts on advanced IC products with densely packed transistor devices.

The present disclosure is directed to various novel methods of forming contact structures on IC products and various novel IC products that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming contact structures on IC products and various novel IC products. One illustrative method disclosed includes, among other things, forming at least one layer of sacrificial material above an underlying conductive structure, forming a sacrificial contact structure in the at least one layer of sacrificial material, the sacrificial contact structure contacting an upper surface of the underlying conductive structure, and removing the at least one layer of sacrificial material and forming at least one layer of insulating material around the sacrificial contact structure. In this example, the method also includes performing at least one process operation to expose an upper surface of the sacrificial contact structure, removing the sacrificial contact structure so as to form a contact opening that exposes the upper surface of the underlying conductive structure and forming a final contact structure in the contact opening, the final contact structure conductively contacting the underlying conductive structure.

One illustrative transistor device disclosed herein includes a gate structure positioned above at least an active region, wherein the gate structure has an axial length in a direction corresponding to a gate width direction of the transistor device. In this example, a first portion of the axial length of the gate structure has a first upper surface and a second portion of the axial length of the gate structure has a second upper surface, wherein the first upper surface is positioned at a level that is above a level of the second upper surface. The device also includes a gate contact structure that contacts the first upper surface of the gate structure.

Another illustrative device disclosed herein includes a gate structure for a transistor device, at least one layer of insulating material positioned above the gate structure, wherein the at least one layer of insulating material has an upper surface that is positioned at a first level, and an internal sidewall spacer positioned within an opening in the at least one layer of insulating material. In this example, the device also includes a conductive member positioned within the internal sidewall spacer, wherein the conductive member has an axial length and a recessed upper surface that is positioned at a second level that is below the first level. This illustrative example also includes an insulating contact cap positioned above the recessed upper surface of the conductive member, wherein the insulating contact cap is positioned above a first portion of the axial length of the conductive member while a second portion of the axial length of the conductive member is not covered by the insulating contact cap. The device also includes a gate contact structure that conductively contacts the gate structure, wherein at least a portion of the gate contact structure is positioned vertically above at least one of the internal sidewall spacer or the insulating contact cap.

BRIEF DESCRIPTION OF THE DRAWINGS

The disclosure may be understood by reference to the following description taken in conjunction with the accompanying drawings, in which like reference numerals identify like elements, and in which:

FIGS. 11-25 depict other novel methods of forming contact structures on IC products and other novel IC products.

Figure 1:
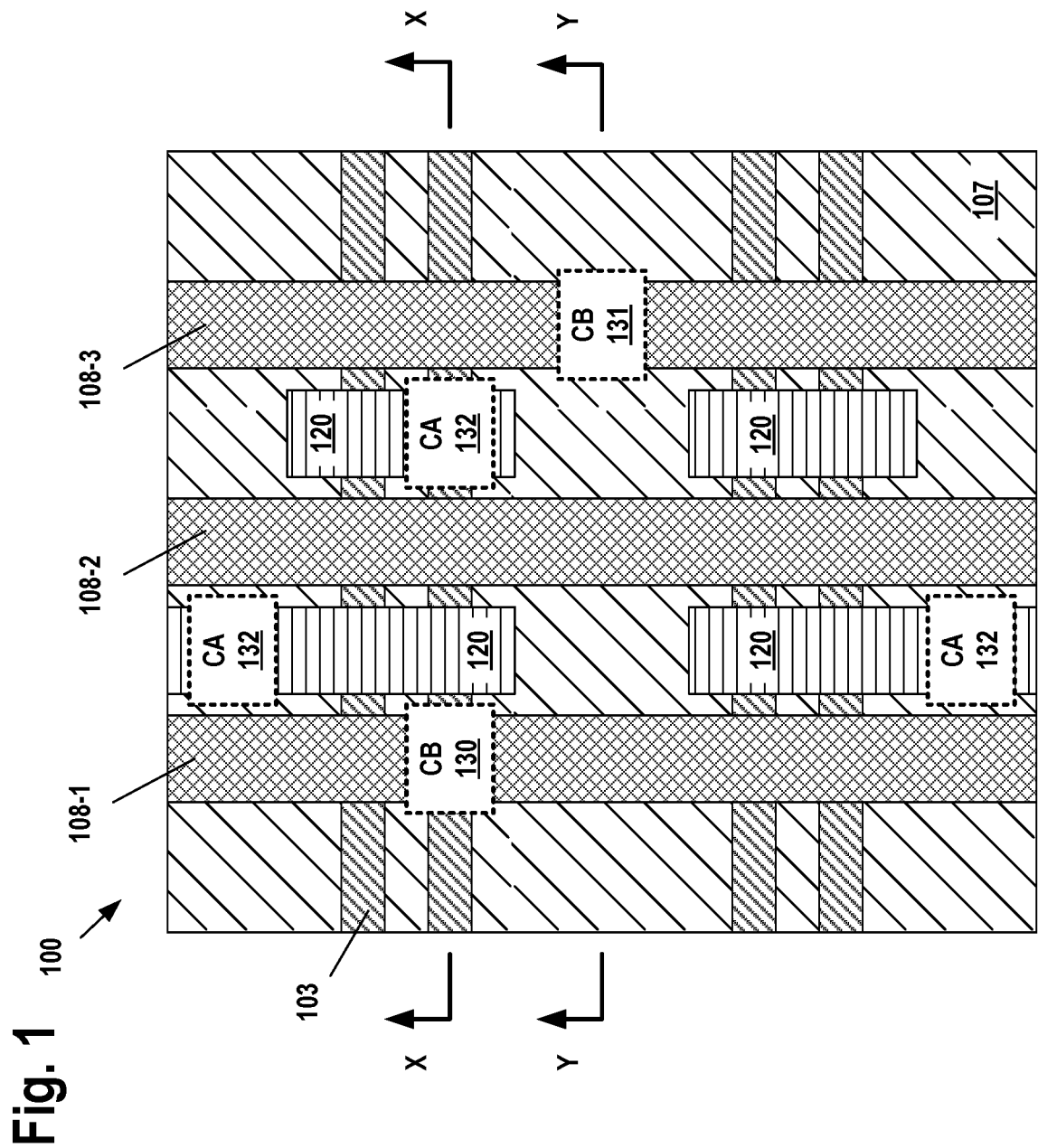
FIGS. 1-10 depict various novel methods of forming contact structures on IC products and various novel IC products.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various novel methods of forming contact structures on IC products and various novel IC products. The various methods disclosed herein with be described in the illustrative context of forming device level contact structures, such as source/drain contact structures and gate contact structures, on IC products. However, as will be appreciated by those skilled in the art after a complete reading of the present application, the various novel methods and devices disclosed herein are not limited to the formation of device level contacts. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. In the illustrative examples depicted herein, the transistor devices will be FinFET devices. The gate structures for the transistor devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1-10 depict various novel methods of forming contact structures, such as source/drain and gate contact structures, on IC products and various novel IC products. FIG. 1 is a simplistic plan view of one illustrative embodiment of an IC product 100 that may be formed using the methods described herein. FIGS. 2-10 contain two cross-sectional views ("X-X" and "Y-Y") of the product 100 taken where indicated in FIG. 1. The cross-sectional views are taken in the gate length direction of the transistor devices.

Figure 2:
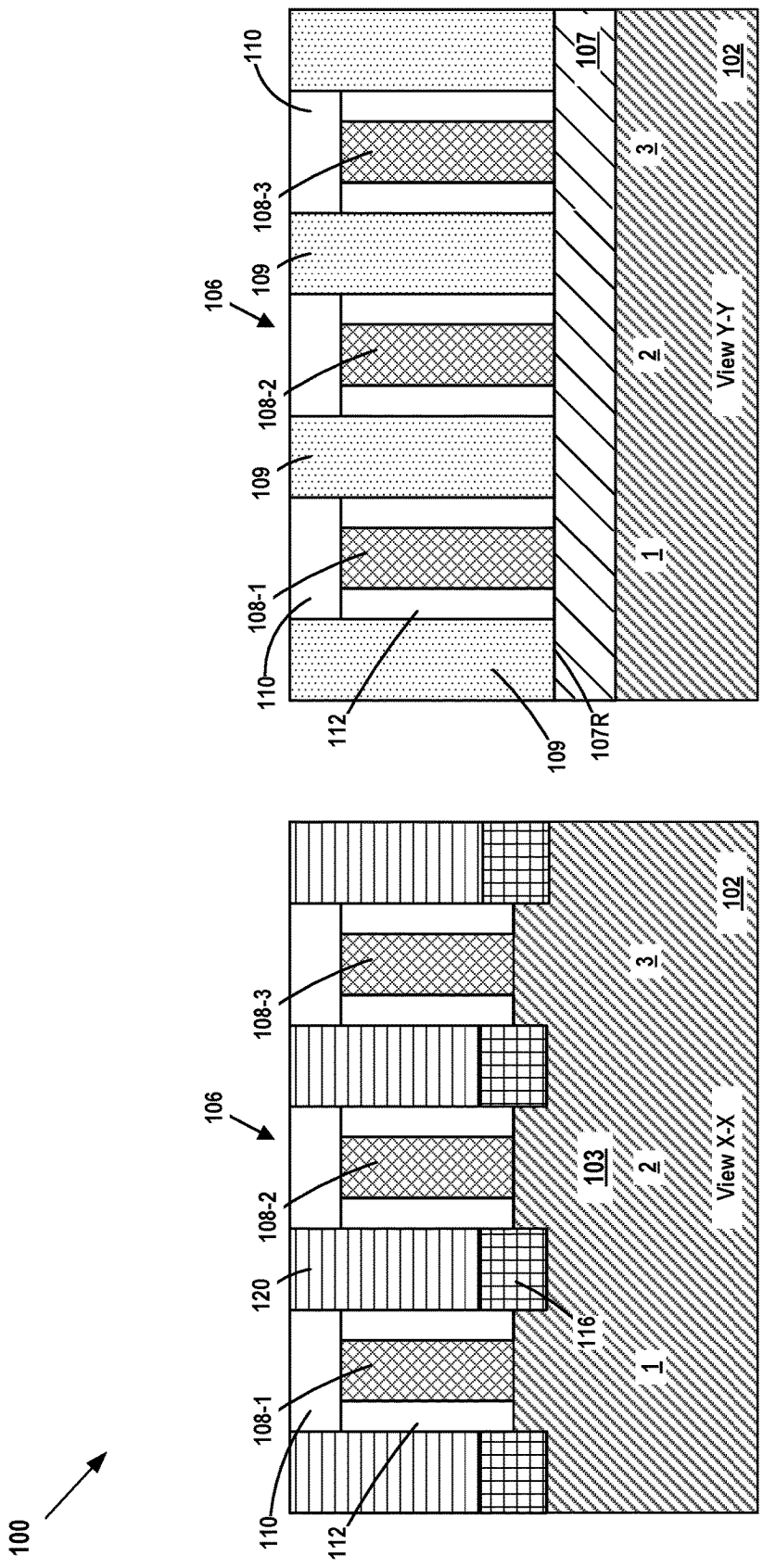

With reference to FIGS. 1 and 2, the product 100 generally comprises a plurality of gates 106 (see FIG. 2; numbered 1-3 for ease of reference) for various transistor devices that are formed in and above a semiconductor substrate 102. In the illustrative example depicted herein, the transistor devices are FinFET devices, but the inventions disclosed herein should not be considered to be limited to IC products that include FinFET transistor devices. A plurality of fins 103 have been formed in the substrate 102 using traditional manufacturing techniques, and the gates 106 have been formed across the fins 103 at this point in the process flow. Also depicted are illustrative source/drain contact structures 120 (e.g., trench silicide structures) that are conductively coupled to the source/drain regions of the transistor devices.

FIG. 1 also depicts an illustrative CB gate contact structure 130 that will be formed to contact the gate structure 108-1 of gate 1. The CB gate contact structure 130 will be positioned above the active region of the transistor. As used herein, the term "active region" should be understood to be the area or "footprint" occupied by the two conductive source/drain contact structures 120 (only one of which is shown in FIG. 1) that are positioned on opposite sides of gate 1 as well as the portion of gate 1 itself that is positioned between the two source/drain contact structures 120. Also shown in FIG. 1 are pluralities of CA contact structures 132 that will be formed to contact the source/drain contact structures 120 of the various transistor devices. Finally, FIG. 1 depicts another CB gate contact structure 131 that will be formed to contact the gate structure 108-3 of gate 3. The CB gate contact structure 131 will be positioned entirely above isolation material 107, e.g., silicon dioxide.

As indicated above, the drawings included herein also include two cross-sectional views ("X-X" and "Y-Y") that are taken where indicated in FIG. 1. More specifically, the cross-sectional view X-X is taken through the gates 106 in a gate-length direction of the transistor devices at a location where the CB gate contact structure 130 and one of the CA contact structures 132 will be formed. In the case where the transistor devices are FinFET devices, the view X-X should be understood to be a cross-sectional view taken through the long axis of a fin 103 of the transistor in a direction that corresponds to the gate length (current transport) direction of a FinFET device. The cross-sectional view Y-Y is taken through the gates 106 in a gate-length direction of the transistor devices at a location where the CB gate contact structure 131 will be formed above the isolation material 107.

The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIG. 2 depicts the IC product 100 after several process operations were performed. First, as noted above, the fins 103 were formed by performing one or more etching processes, e.g., anisotropic etching processes, through a patterned fin-formation etch mask (not shown) to form a plurality of fin-formation trenches in the substrate 102 and thereby define a plurality of fins 103. The width and height of the fins 103 may vary depending upon the particular application. Additionally, the overall size, shape and configuration of the fin-formation trenches and fins 103 may vary depending on the particular application. Next, a layer of insulating material 107 (e.g., silicon dioxide) was then deposited so as to overfill the fin-formation trenches. A chemical mechanical polishing (CMP) process was then performed to planarize the upper surface of the layer of insulating material 107 with the upper surface of the fins 103, thereby removing the patterned fin-formation hard mask. Next, a recess etching process was performed on the layer of insulating material 107 such that it has a recessed upper surface 107R that exposes a desired amount of the fins 103 above the recessed upper surface 107R.

Still with reference to FIG. 2, after the layer of insulating material 107 was recessed, the gates 106 were formed above the fins 103. Each of the gates 106 includes a schematically depicted final gate structure 108 (numbered 1-3 for reference purposes), a gate cap 110 and a sidewall spacer 112. However, it should be noted that, in some embodiments, the gate cap 110 may be omitted; i.e., the top of the gate structure may extend all the way to the top of the insulating material 109. The sidewall spacers 112 and the gate caps 110 may be comprised of a variety of different materials, such as silicon nitride, SiNC, SiN, SiCO, SiNOC, etc., and they may be made of the same or different materials. In one illustrative embodiment, the spacers 112 may be made of a low-k material (i.e., a material having a dielectric constant less than 7). As will be appreciated by those skilled in the art after a complete reading of the present application, in one illustrative embodiment, the spacers 112 and the gate caps 110 may be made of the same material (e.g., silicon nitride), which makes processing less complex as compared to situations where the spacers 112 and gate caps 110 are made of different materials (i.e., the spacer material may be a material with a lower k value), but they both may be, for example, nitride-based materials that exhibit similar etch characteristics. Typically, when the gate structures 108 are manufactured using known replacement gate manufacturing techniques, the materials for the gate structures 108 are sequentially formed in gate cavities between the spacers 112 after removal of a sacrificial gate electrode (not shown) and a sacrificial gate insulation layer (not shown). The gate structures 108 are typically comprised of a high-k gate insulation layer (not shown), such as hafnium oxide, a material having a dielectric constant greater than 10, etc., and one or more conductive material layers that function as the gate electrode of the gate structure 108. For example, one or more work-function adjusting metal layers and a bulk conductive material may be deposited to form the gate electrode structure.

Still referencing FIG. 2, prior to the formation of the final gate structures 108, epi semiconductor material 116 was formed on the exposed portions of the active regions (or fins 103 in the case of a FinFET device), i.e., in the source/drain regions of the devices, by performing an epitaxial growth process. The epi material 116 may be formed to any desired thickness. However, it should be understood that the epi material 116 need not be formed in all applications. Other layers of material, such as contact etch stop layers and the like, are not depicted in the drawings. Also depicted are illustrative source/drain contact structures 120 which typically include a so-called "trench silicide" (TS) structure (not separately shown). As indicated, the upper surface of the source/drain contact structures 120 is typically approximately level with the upper surface of the gate caps 110.

After formation of the epi material 116, a layer of insulating material 109 (e.g., silicon dioxide) was blanket-deposited across the substrate. Thereafter a CMP process was performed to planarize the layer of insulating material 109 using the original gate caps (not shown) positioned above the sacrificial gate structures as a polish stop layer. At that point, traditional replacement gate manufacturing processes were performed to remove the original gate caps and the sacrificial gate structures and to form the final gate structures 108. At that point, in this particular embodiment, the optional gate caps 110 were formed on the product 100. Next, portions of the insulating material 109 above the source/drain regions were removed and the above-referenced source/drain contact structures 120 were formed in the source/drain regions of the devices.

Figure 3:
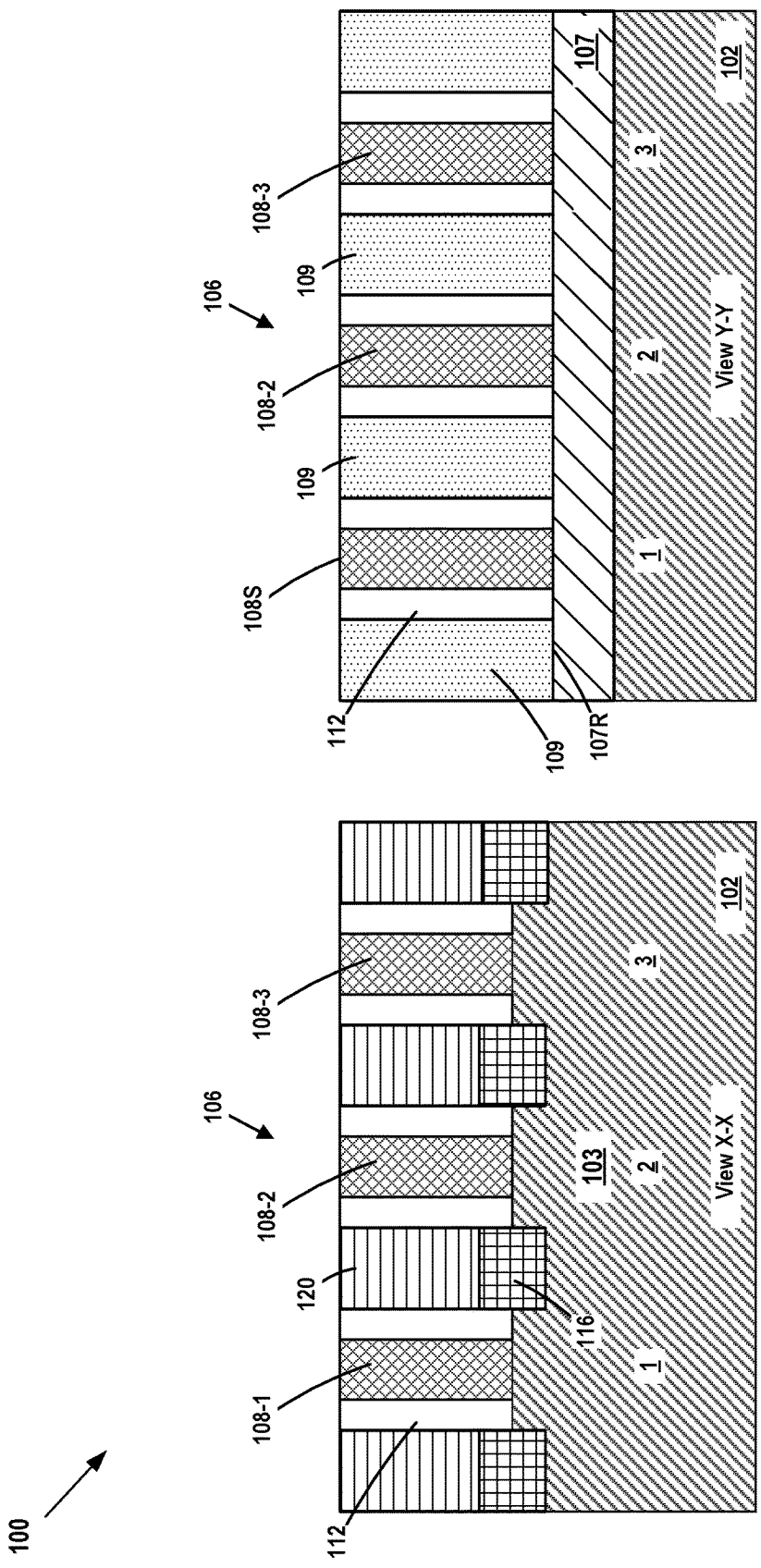

FIG. 3 depicts the IC product 100 after one or more CMP (chemical mechanical polishing) or etch-back processes were performed to remove the gate caps 110 and portions of the source/drain contact structures 120 and the layer of insulating material 109. At the conclusion of these process operations, the upper surface 108S of the final gate structures 108 are exposed.

Figure 4:
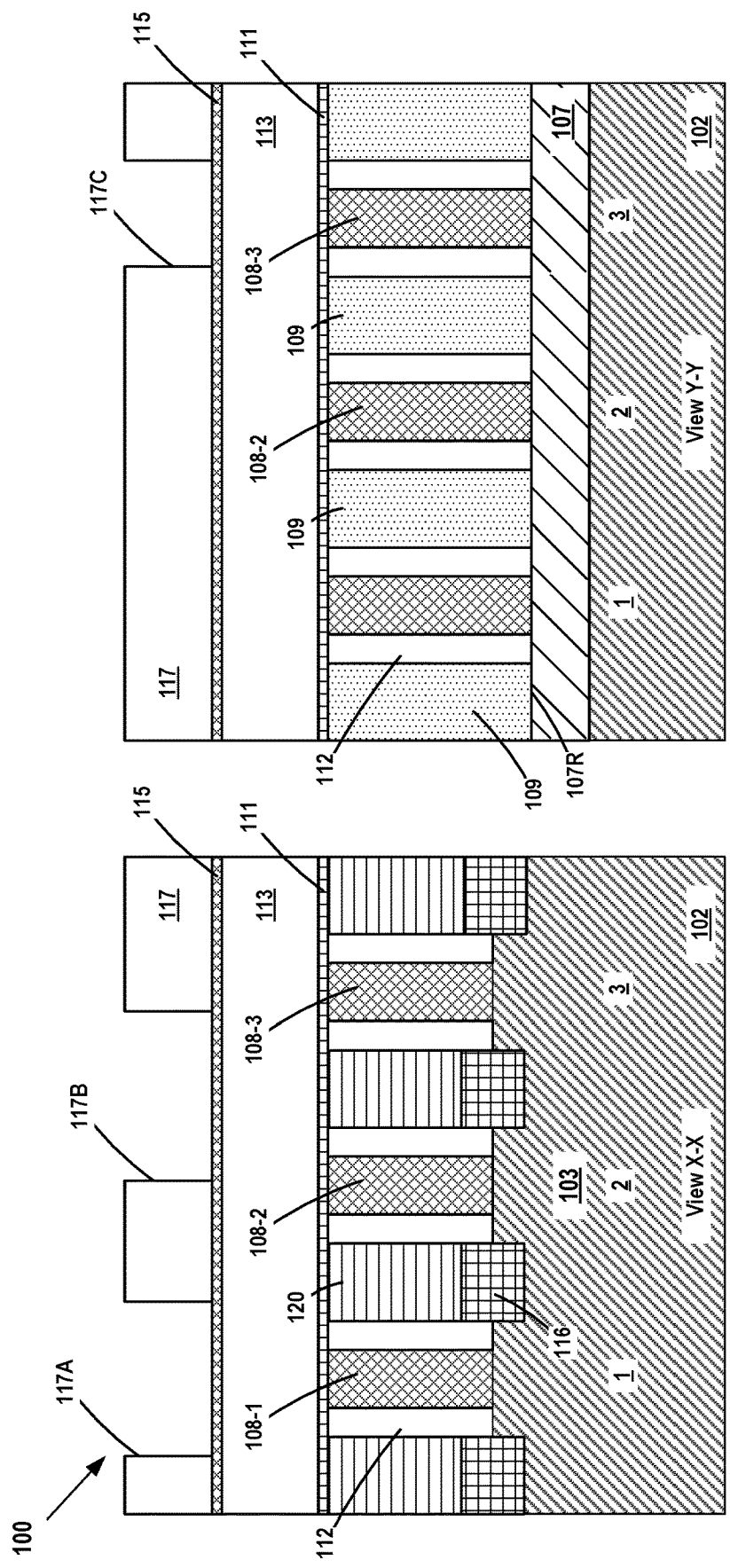

FIG. 4 depicts the product 100 after several process operations were performed. First, at least one layer of sacrificial material was formed above the substrate. More specifically, in one illustrative process flow, a relatively thin etch stop layer 111 was initially blanket-deposited on the product. Then, a layer of masking material 113, e.g., OPL, was formed on the etch stop layer 111. Next, an ARC (anti-reflective coating) layer 115 was formed on the layer of masking material 113. Thereafter, a patterned etch mask 117 (e.g., a patterned layer of photoresist) was formed above the ARC layer 115. The patterned etch mask 117 has a plurality of openings 117A-C that each have a generally rectangular configuration when viewed from above. These various layers of material may be formed to any desired thickness and they may be made from a variety of different materials. For example, the etch stop layer 111 may be made of a variety of different materials, e.g., SiN, SiCO, SiC, $Al_2O_3$, $HfO_2$, etc., and it should be made of a material that exhibits good etch selectivity relative to the materials of construction of the underlying materials. The ARC layer 115 may be made of materials such as, for example, $TiO_x$, SiARC, LTO, etc.

Figure 5:
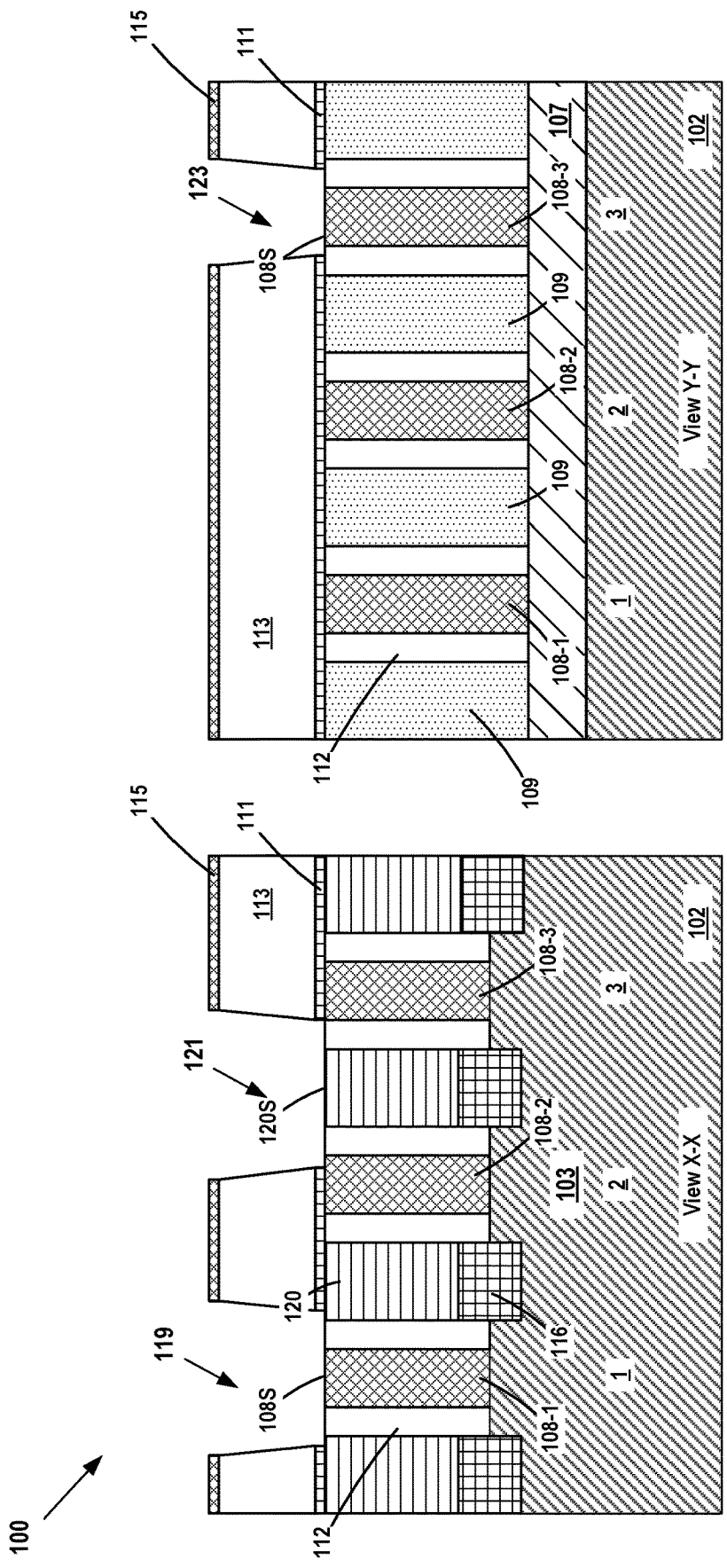

FIG. 5 depicts the product 100 after several process operations were performed. First, one or more etching processes were performed through the patterned etch mask 117 (see FIG. 4) to remove portions of the ARC layer 115 and the masking layer 113. At that point, in some process flows, the patterned etch mask 117 may be removed. Then, another etching process was performed to remove the exposed portions of the etch stop layer 111. These process operations result in the formation of openings 119, 121 and 123. The opening 119 exposes the upper surface 108S of a portion of the axial length (into and out of the plane of the drawing page) of the gate structure 108-1; the opening 121 exposes the upper surface 120S of a portion of the axial length of the source/drain contact structure 120 positioned between gates 2 and 3; and the opening 119 exposes the upper surface 108S of a portion of the axial length of the gate structure 108-3.

Figure 6:
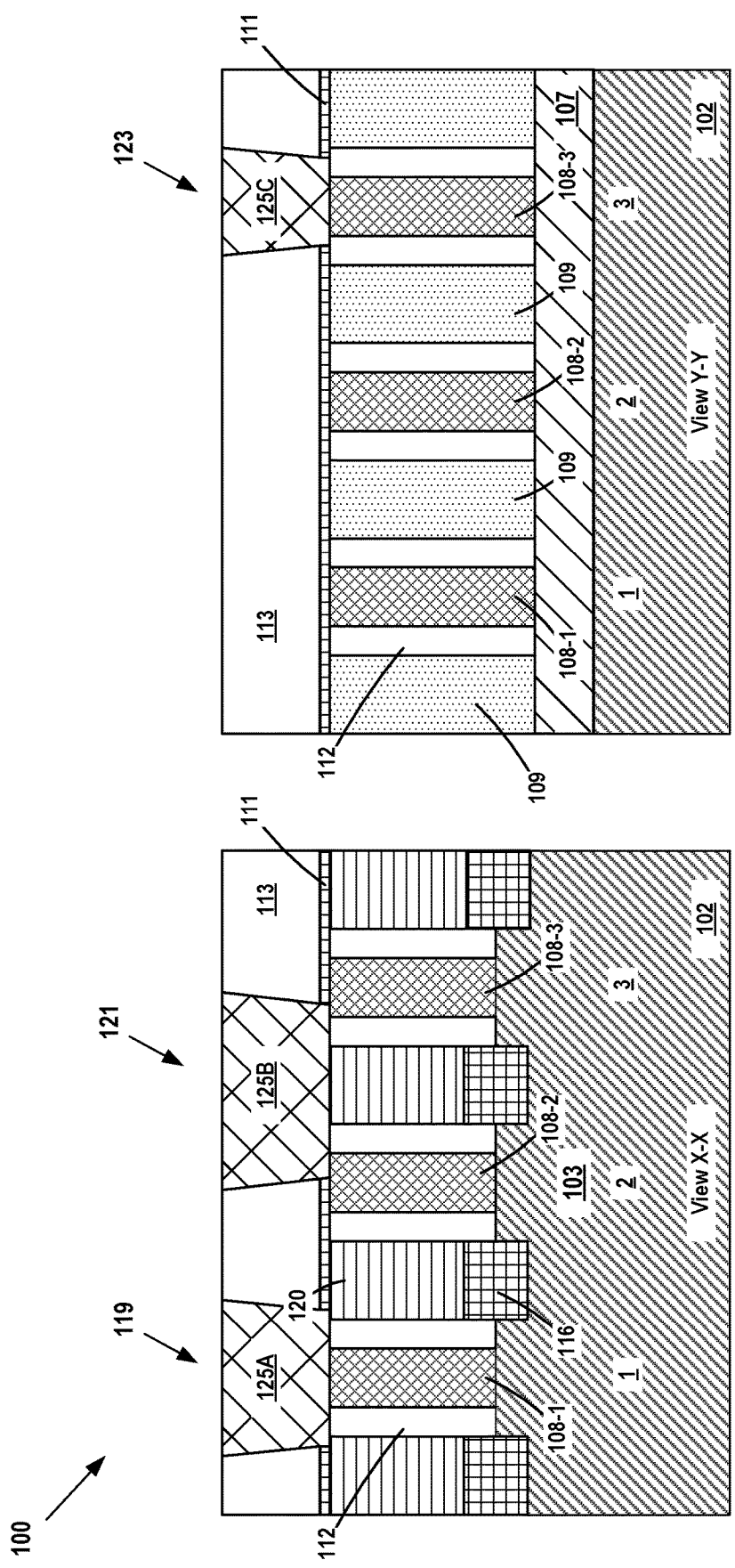

FIG. 6 depicts the product 100 after sacrificial contact structures 125A-C (collectively referenced using the numeral 125) were formed in the openings 119, 121 and 123, respectively, and after the ARC layer 115 was removed. The sacrificial contact structures 125 may be comprised of a variety of different materials, e.g., amorphous silicon, silicon nitride, etc. The sacrificial contact structures 125 may be formed by depositing material for the sacrificial contact structures 125 across the substrate so as to over-fill the openings 119, 121 and 123, and thereafter performing a CMP or etch-back process to remove excess amounts of the material for the sacrificial contact structures 125 as well as the ARC layer 115.

Figure 7:
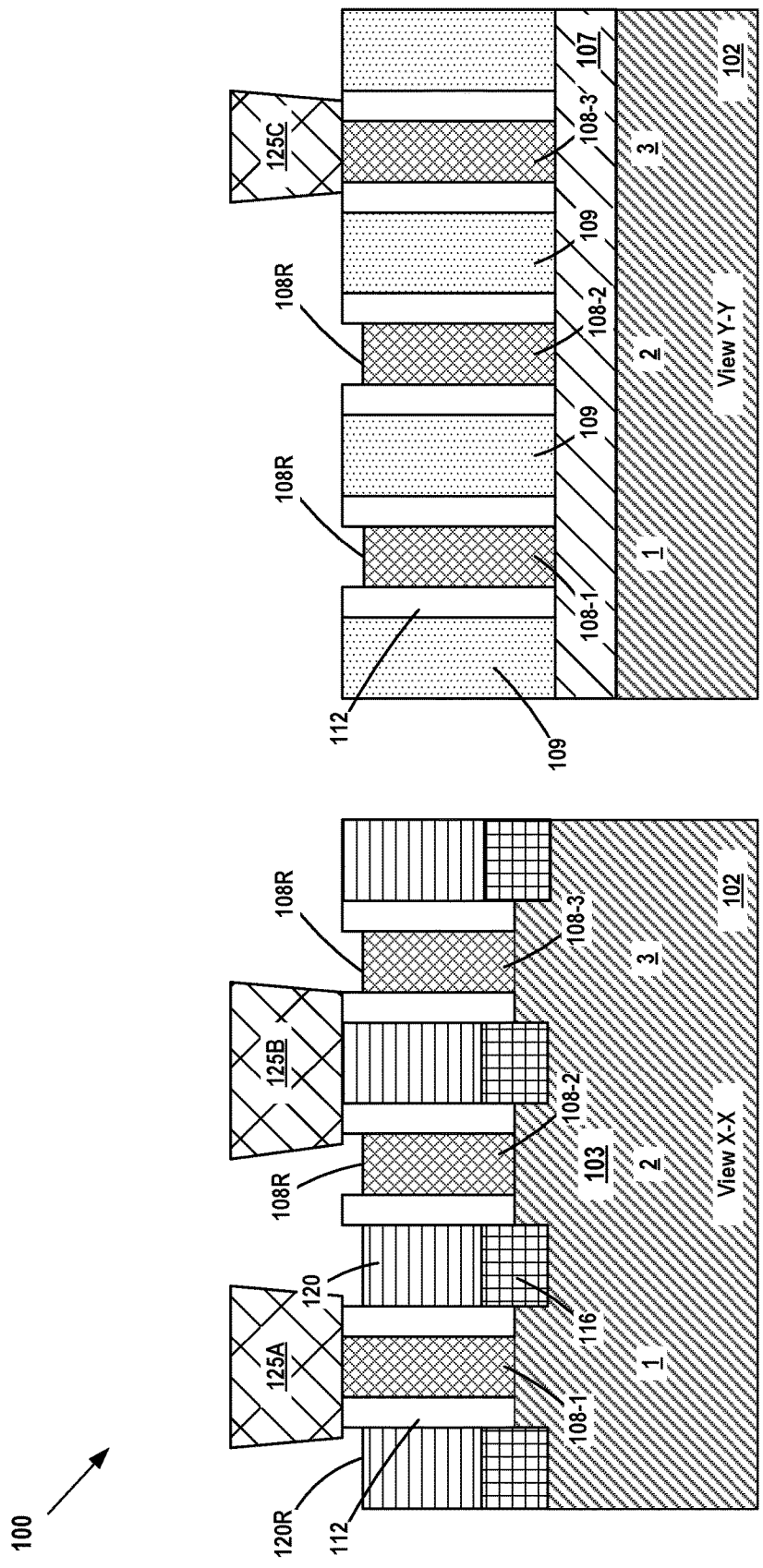

FIG. 7 depicts the product 100 after several process operations were performed. First, one or more etching processes were performed to remove the remaining portions of the layer of masking material 113 and the etch stop layer 111. Then, one or more recess etching processes were performed to recess the exposed portions of the conductive gate structures 108 and the conductive source/drain contact structures 120 that are not covered by the sacrificial contact structures 125. The recessing of these conductive structures is performed so as to provide an increased spacing between the conductive structures and the CB gate contact structure 130, the CA gate contact structure 131 and the CA contact structure 132 that will be formed on the product 100, as described more fully below. At the conclusion of these process operations, exposed portions of the gate structures 108 have a recessed upper surface 108R (including portions of the gate structures 108-1, 108-3 on opposite sides of the sacrificial contact structures 125A, 125C, respectively), while exposed portions of the source/drain contact structures 120 have a recessed upper surface 120R (including portions of the source/drain contact structure 120 on opposite sides of the sacrificial contact structure 125B). The amount of recessing of the exposed portions of the gate structures 108 and the exposed portions of the source/drain contact structures 120 may vary depending upon the particular application (e.g., 5-15 nm). In one illustrative embodiment, the recess etching process performed on the gate structures 108 and the source/drain contact structures 120 may include a directional (anisotropic) etching process followed by a relatively brief isotropic etching process. Such an etching sequence is performed to limit the amount of material of the gate structures 108-1 and 108-3 removed from under the edges of the sacrificial contact structures 125A and 125C, respectively, during the isotropic portion of the etching sequence. However, such material removal or undercutting is not shown in the drawings. Similarly, in one embodiment, the recess etching process performed to recess the source/drain contact structures 120 may include a directional (anisotropic) etching process followed by a relatively brief isotropic etching process so as to limit the amount of material of the source/drain contact structure 120 removed from under the edges of the sacrificial contact structure 125B. As before, such material removal or undercutting is not shown in the drawings.

Figure 8:
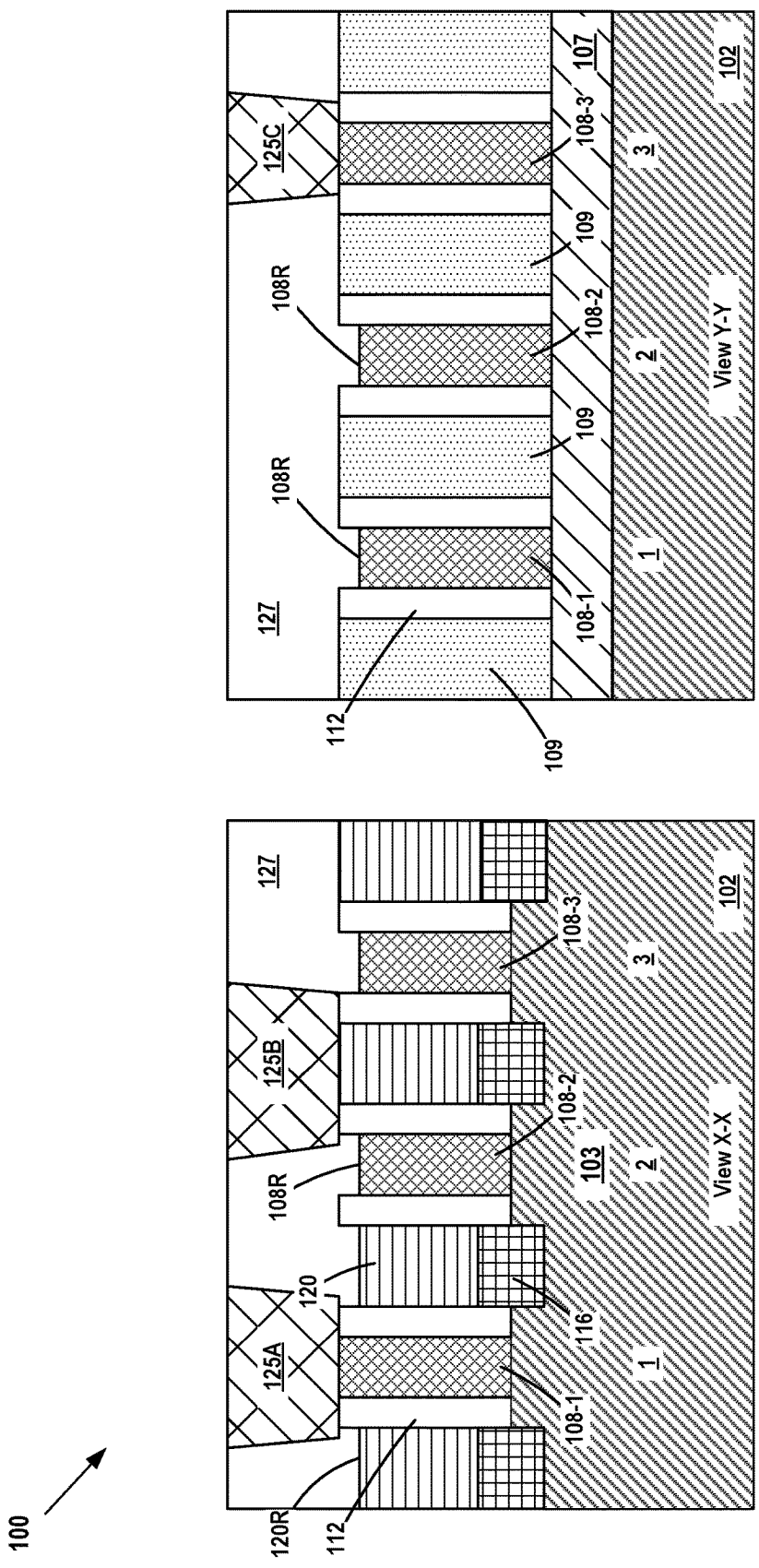

FIG. 8 depicts the product 100 after several process operations were performed. First, one or more layers of insulating material 127, e.g., silicon dioxide, a low-k oxide (k value less than 3.9), etc., was deposited so as to over-fill the spaces between the sacrificial contact structures 125 and the spaces above the recessed portions of the gate structures 108 and recessed portions of the source/drain contact structures 120. In one illustrative process flow, the insulating material 127 may be formed by performing an ALD process to insure that substantially all of the spaces under the sacrificial contact structures 125 are filled, and thereafter performing a CVD process to deposit the bulk of the insulating material 127. Thereafter, a CMP or etch-back process was performed to remove excess amounts of the insulating material 127 positioned above the upper surfaces of the sacrificial contact structures 125.

Figure 9:
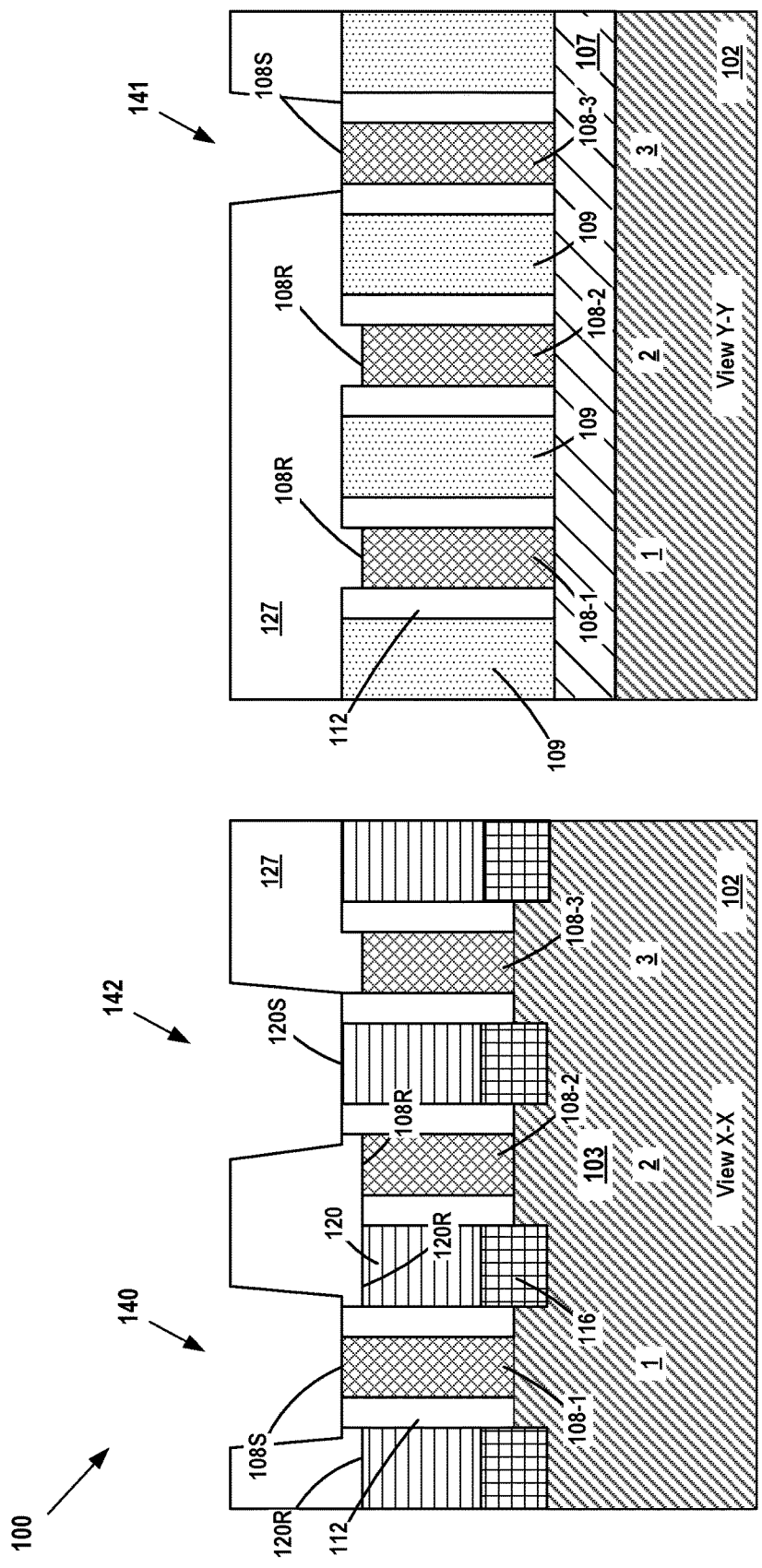

FIG. 9 depicts the product 100 after one or more etching processes were performed to remove the sacrificial contact structures 125, thereby forming device level contact openings 140, 141 and 142 in the insulating material 127. As depicted, the device level contact opening 140 exposes the non-recessed upper surface 108S of the gate structure 108-1; the device level contact opening 141 exposes the non-recessed upper surface 108S of the gate structure 108-3; and the device level contact opening 142 exposes the non-recessed upper surface 120S of the source/drain contact structure 120. Note that, in this embodiment, the contact openings 140, 141 and 142 are laterally bounded or defined by the one or more layers of insulating material 127.

Figure 10:
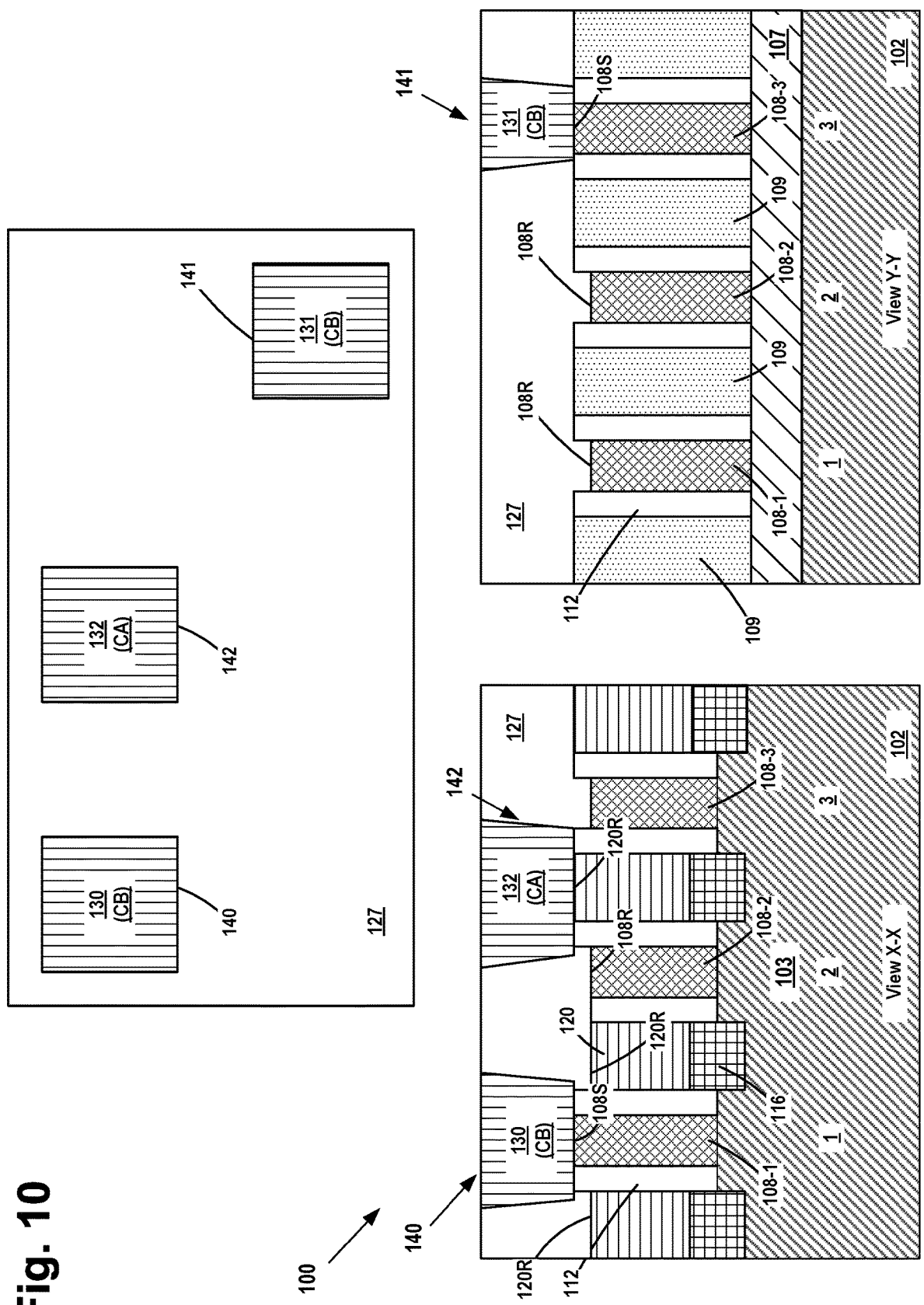

FIG. 10 depicts the product 100 after several process operations were performed to form the CB gate contact structure 130, the CB gate contact structure 131 and the CA contact structure 132 in the device level contact openings 140, 141 and 142, respectively. FIG. 10 also contains a simplistic plan view (not to scale) showing the contact structures 130, 131 and 132. In this embodiment, the at least one layer of insulating material 127 is positioned around each of the contact structures 130, 131 and 132. In one particular embodiment, the at least one layer of insulating material 127 physically contacts the contact structures 130, 131 and 132. The CB gate contact structure 130, the CB gate contact structure 131 and the CA contact structure 132 may be comprised of a variety of different materials and they may be formed by various manufacturing techniques. In one illustrative example, one or more conformal barrier layers and/or seed layers (not separately shown) were formed so as to line the device level contact openings 140, 141 and 142 with the barrier material(s). Next, a layer of conductive material (e.g., copper, a metal-containing material, a metal compound, etc.) was then formed on the product 100 so as to overfill the device level contact openings 140, 141 and 142. At that point, a CMP process was performed to remove excess portions of the conductive materials from above the upper surface of the layer of insulating material 127. These process operations result in the formation of a CB contact 130 that is positioned above the active region and conductively contacts the gate structure 108-1 of gate 1; a CB contact 131 that is positioned above isolation material 107 and conductively contacts the gate structure 108-3 of gate 3; and a CA contact structure 132 that conductively contacts the source/drain contact structure 120 positioned laterally between gates 2 and 3. The CB gate contact 130 is positioned entirely above the active region of the upper transistor shown in FIG. 1.

Figure 11:
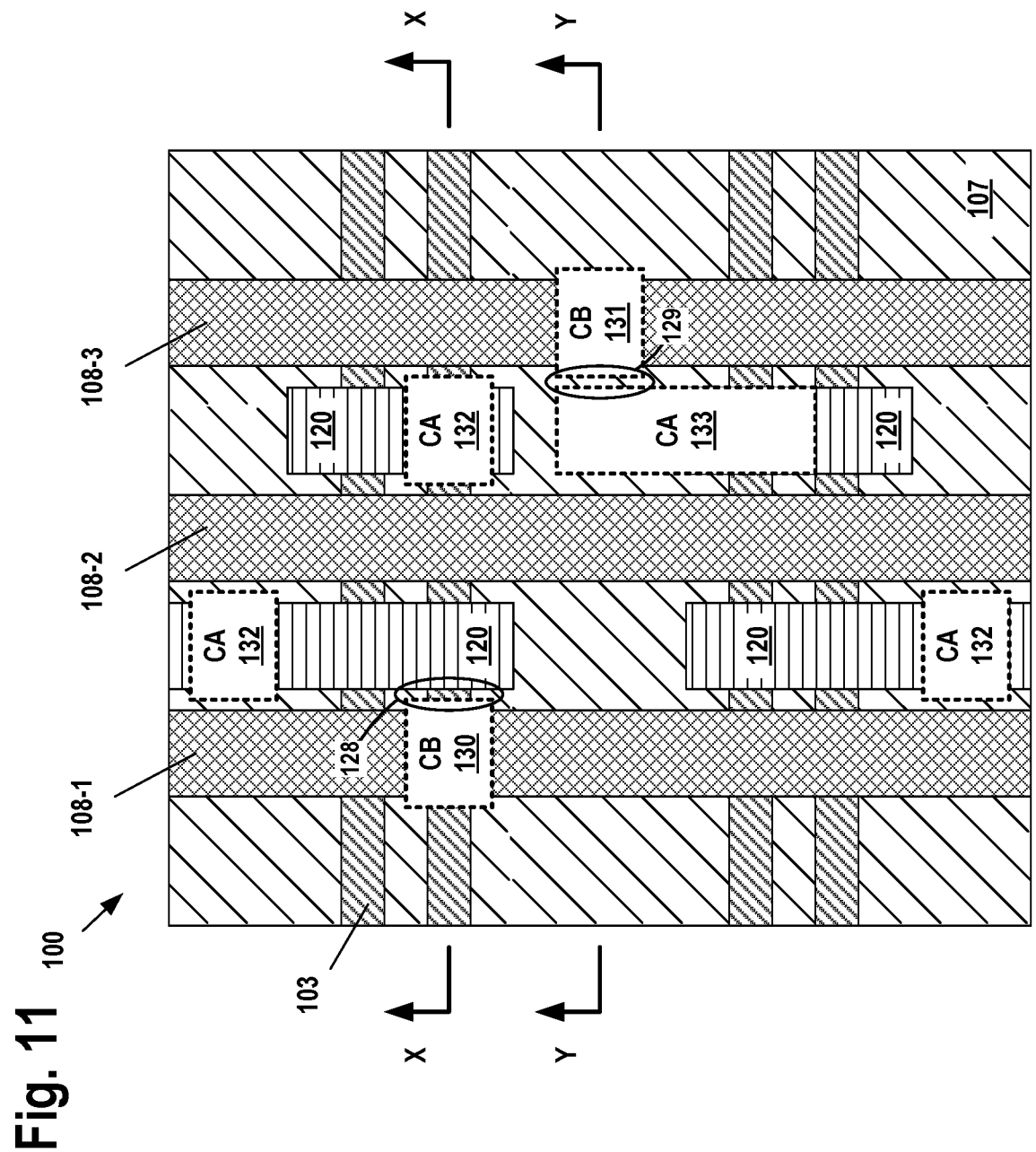

FIGS. 11-25 depict other novel methods of forming contact structures, such as source/drain and gate contact structures, on IC products and other novel IC products. FIG. 11 is a simplistic plan view of one illustrative embodiment of an IC product 100 that may be formed using the methods described herein. FIG. 11 indicates where various cross-sectional views shown in FIGS. 12-25 are taken. In this embodiment, the above-described CB gate contact structure 130, the CB gate contact structure 131 and the CA contact structure 132 will be formed on the product 100, as well as an elongated CA contact structure 133. In modern IC products, although the CB gate contact structure 130 is formed at a level that is above the level of the upper surface of the source/drain contact structure 120, the spacing 128 (nearest point to nearest point) between the CB gate contact structure 130 and the source/drain contact structure 120 can be very small, or even negative (i.e., the nearest edge of the CB gate contact structure 130 may be positioned vertically above the source/drain contact structure 120). In the case where the CB gate contact structure 131 and the elongated CA contact structure 133 are formed laterally adjacent one another at the same level within the product 100, the spacing 129 may also be very small. Formation of device level contacts with such small spacing between adjacent conductive structures can be problematic in that it may lead to the formation of electrical shorts, which can lead to total device failure.

Figure 12:
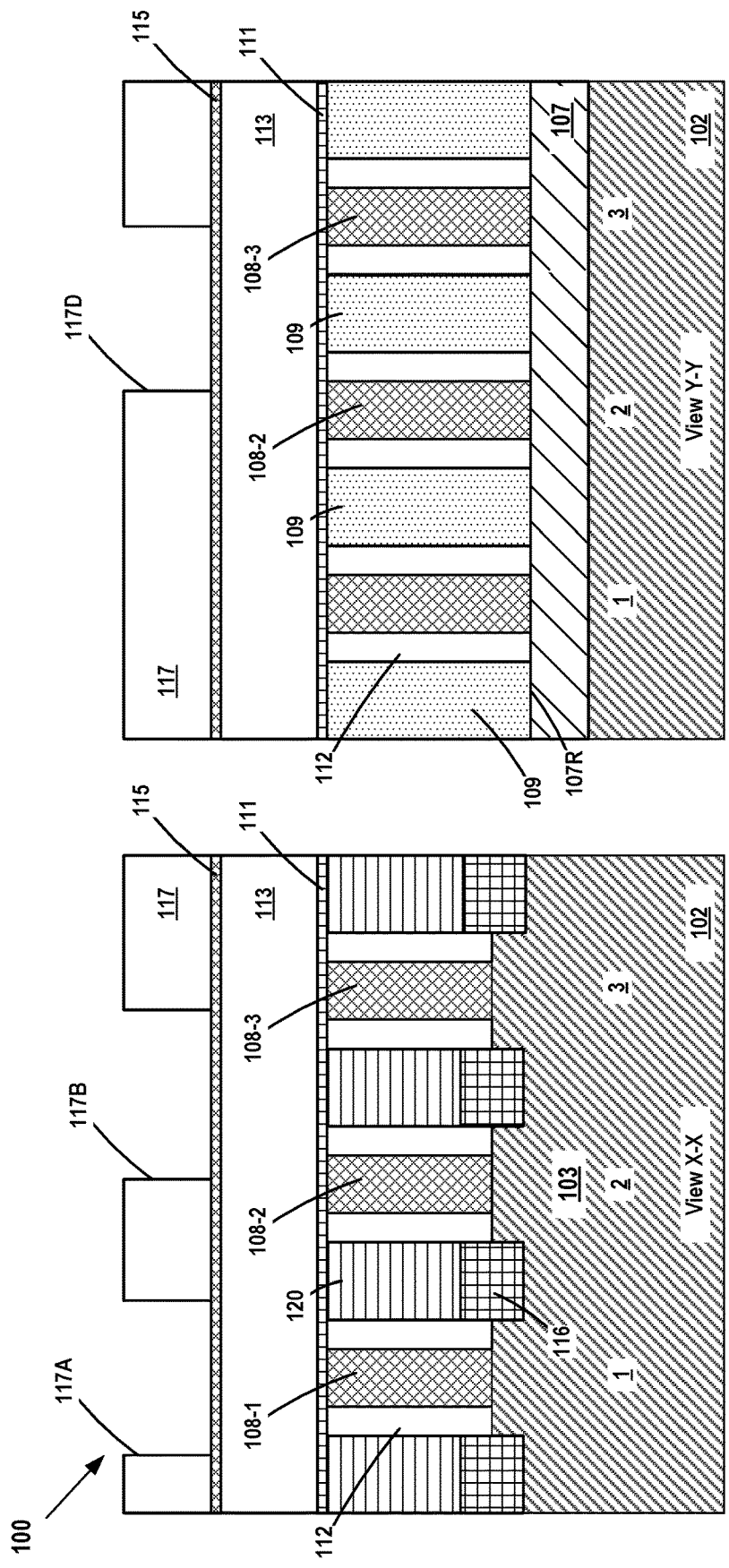

FIG. 12 depicts the product 100 at a point in fabrication that corresponds to that shown in FIG. 4, i.e., after formation of the above-described etch stop layer 111, the layer of masking material 113, the ARC layer 115 and the patterned etch mask 117. In this embodiment, the patterned etch mask 117 comprises the above-described openings 117A, 117B and an opening 117D positioned above a location where the elongated CA contact structure 133 will be formed.

Figure 13:
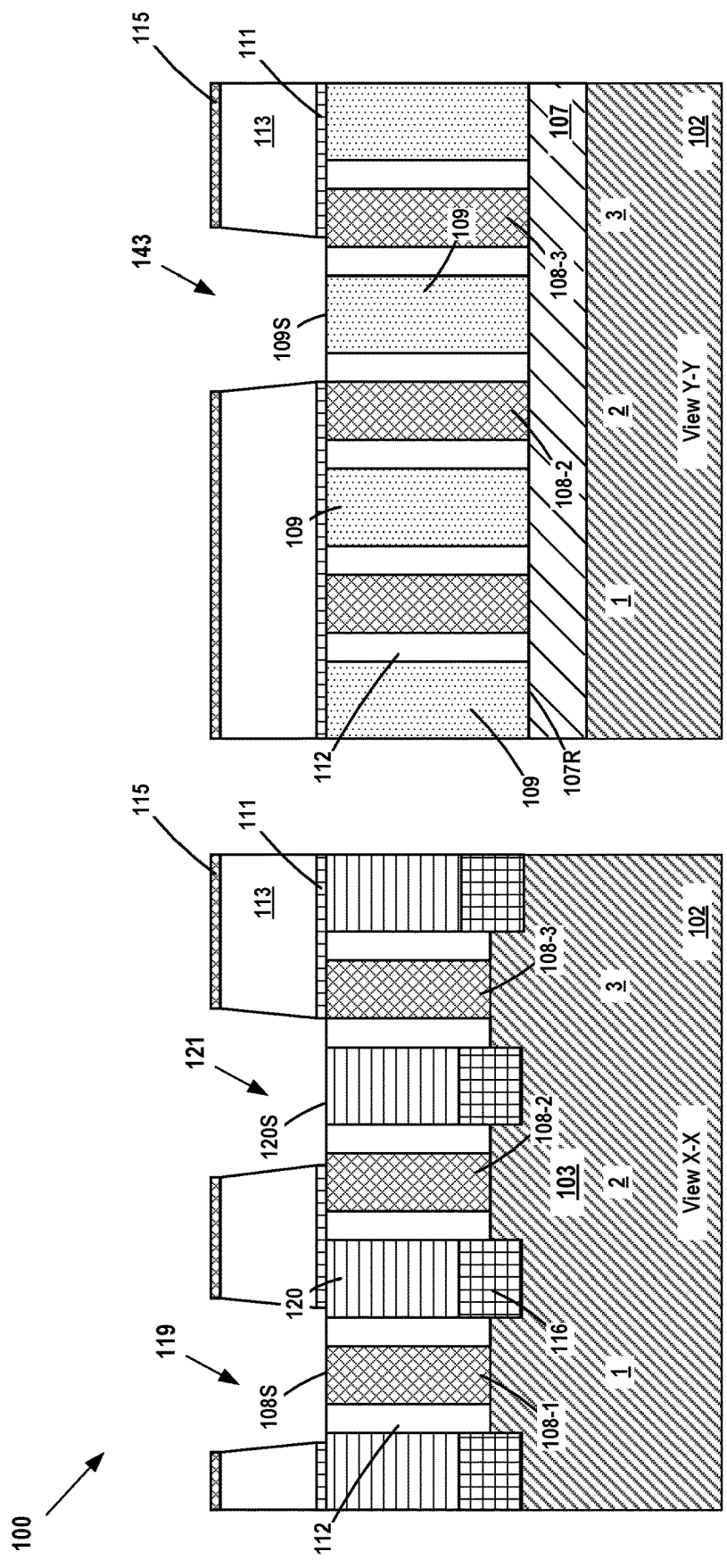

FIG. 13 depicts the product 100 after several process operations were performed. First, one or more etching processes were performed through the patterned etch mask 117 to remove portions of the ARC layer 115 and the masking layer 113. At that point, in some process flows, the patterned etch mask 117 may be removed. Then, another etching process was performed to remove the exposed portions of the etch stop layer 111. These process operations result in the formation of the above-described openings 119 and 121 and the formation of another opening 143. As before, the opening 119 exposes the upper surface 108S of a portion of the axial length of the gate structure 108-1 and the opening 121 exposes the upper surface 120S of a portion of the axial length of the source/drain contact structure 120 positioned between gates 2 and 3. The opening 143 exposes the upper surface 109S of a portion of the insulating material 109 positioned between gates 2 and 3.

Figure 14:
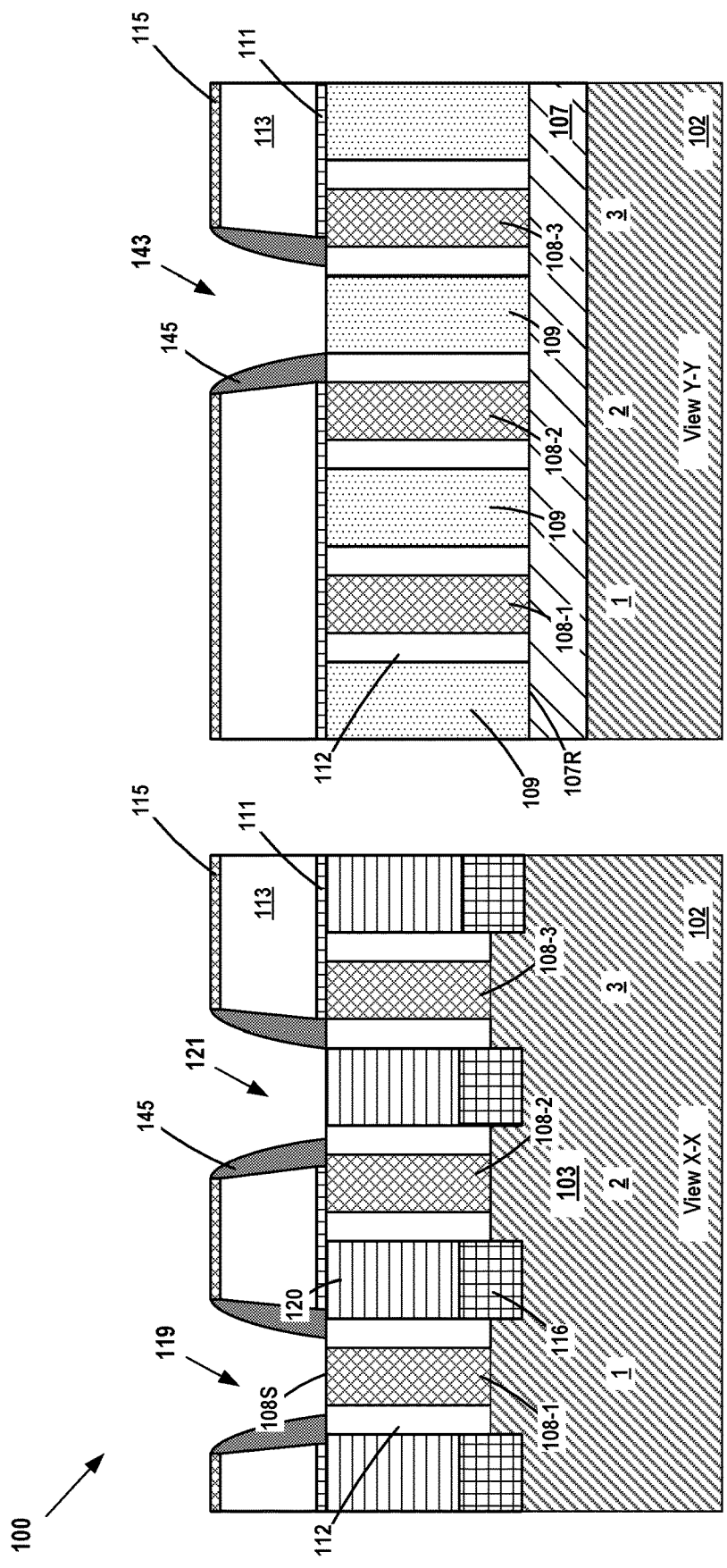

FIG. 14 depicts the product 100 after an internal non-sacrificial sidewall spacer 145 was formed in each of the openings 119, 121 and 143. The sidewall spacer 145 was formed by performing a conformal deposition process to form a conformal layer of spacer material above the substrate 102 and in the openings 119, 121 and 143 and thereafter performing an anisotropic etching process. The sidewall spacer 145 may be comprised of any of a variety of different materials, e.g., silicon dioxide, silicon nitride, SiNC, SiN, SiCO, SiNOC, etc., and it may be formed to any desired thickness (at its base).

Figure 15:
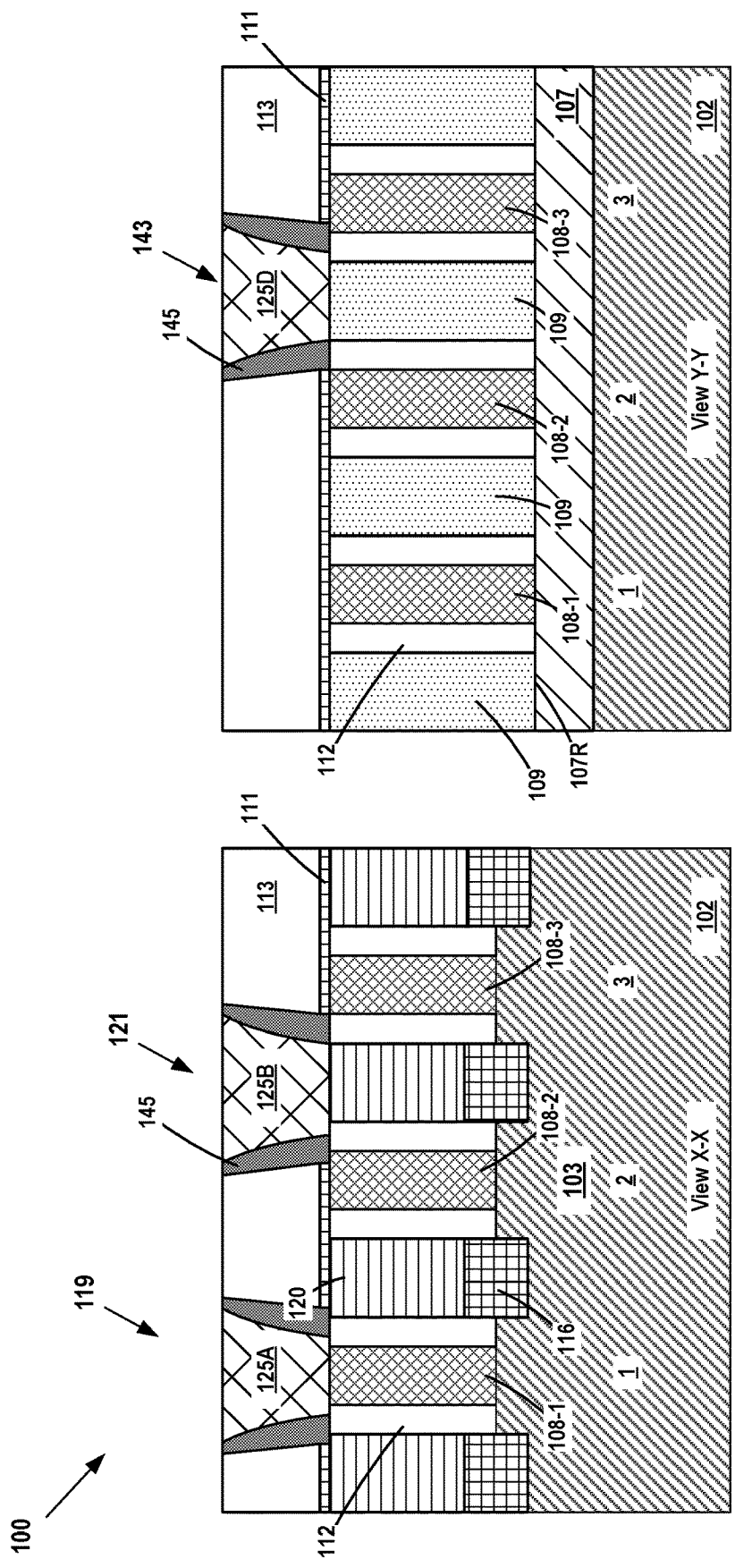

FIG. 15 depicts the product 100 after the above-described sacrificial contact structures 125A and 125B were formed in the openings 119 and 121, and a new sacrificial contact structure 125D was formed in the opening 143 adjacent their respective sidewall spacer 145. The sacrificial contact structure 125D is associated with the formation of the elongated CA contact structure 133.

Figure 16:
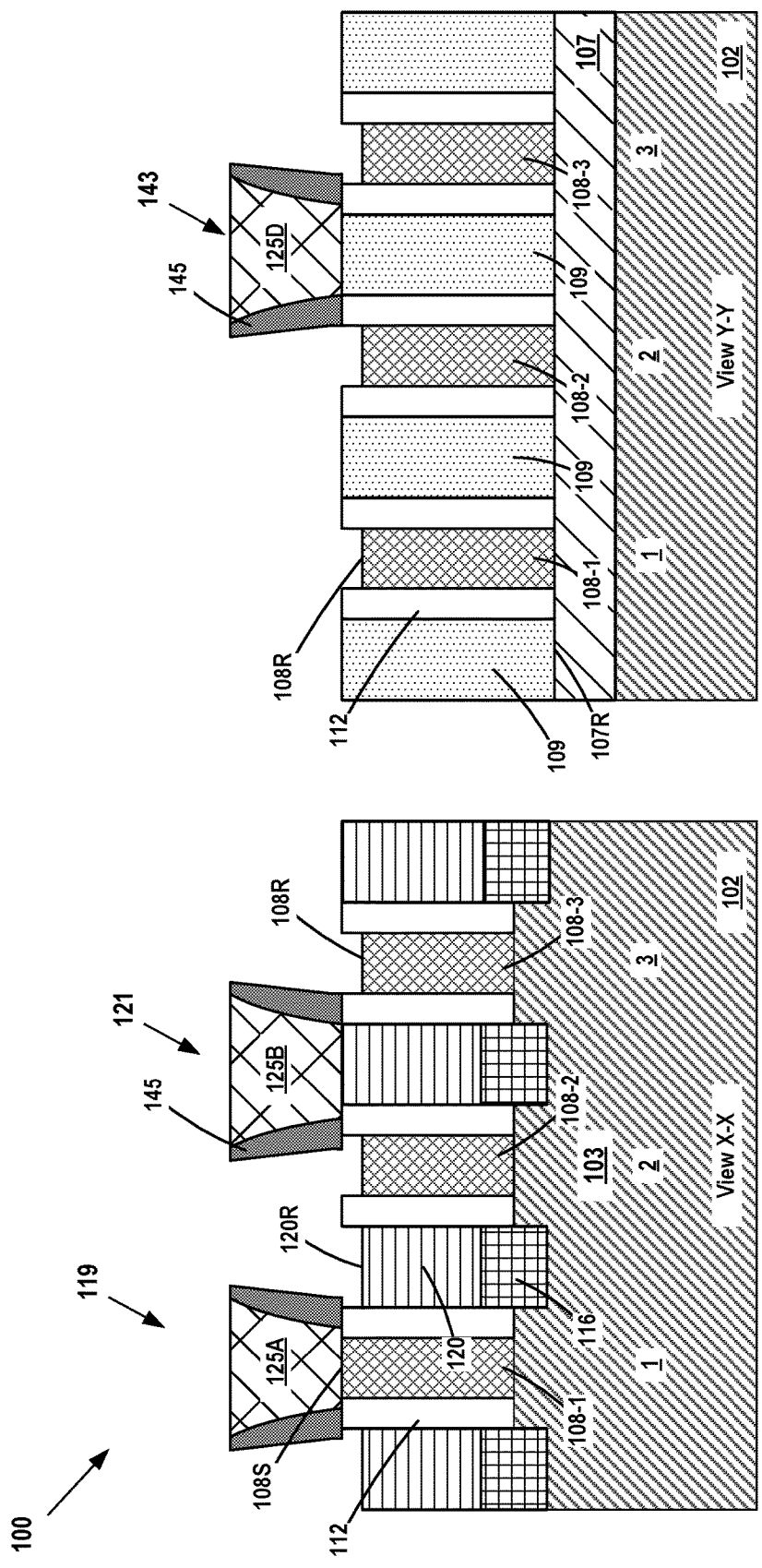

FIG. 16 depicts the product 100 after several process operations were performed. First, one or more of the above-described etching processes were performed to remove the remaining portions of the layer of masking material 113 and the etch stop layer 111. Then, one or more of the above-described anisotropic/isotropic recess etching processes were performed to recess the exposed portions of the gate structures 108 and the source/drain contact structures 120 that are not covered by the sacrificial contact structures 125. As before, at the conclusion of these process operations, exposed portions of the gate structures 108 have a recessed upper surface 108R, while exposed portions of the source/drain contact structures 120 have a recessed upper surface 120R. Note that the portion of the gate structure 108-1 positioned under the sacrificial contact structure 125A is not recessed. Similarly, the portion of the source/drain contact structure 120 positioned under the sacrificial contact structure 125B is not recessed.

Figure 17:
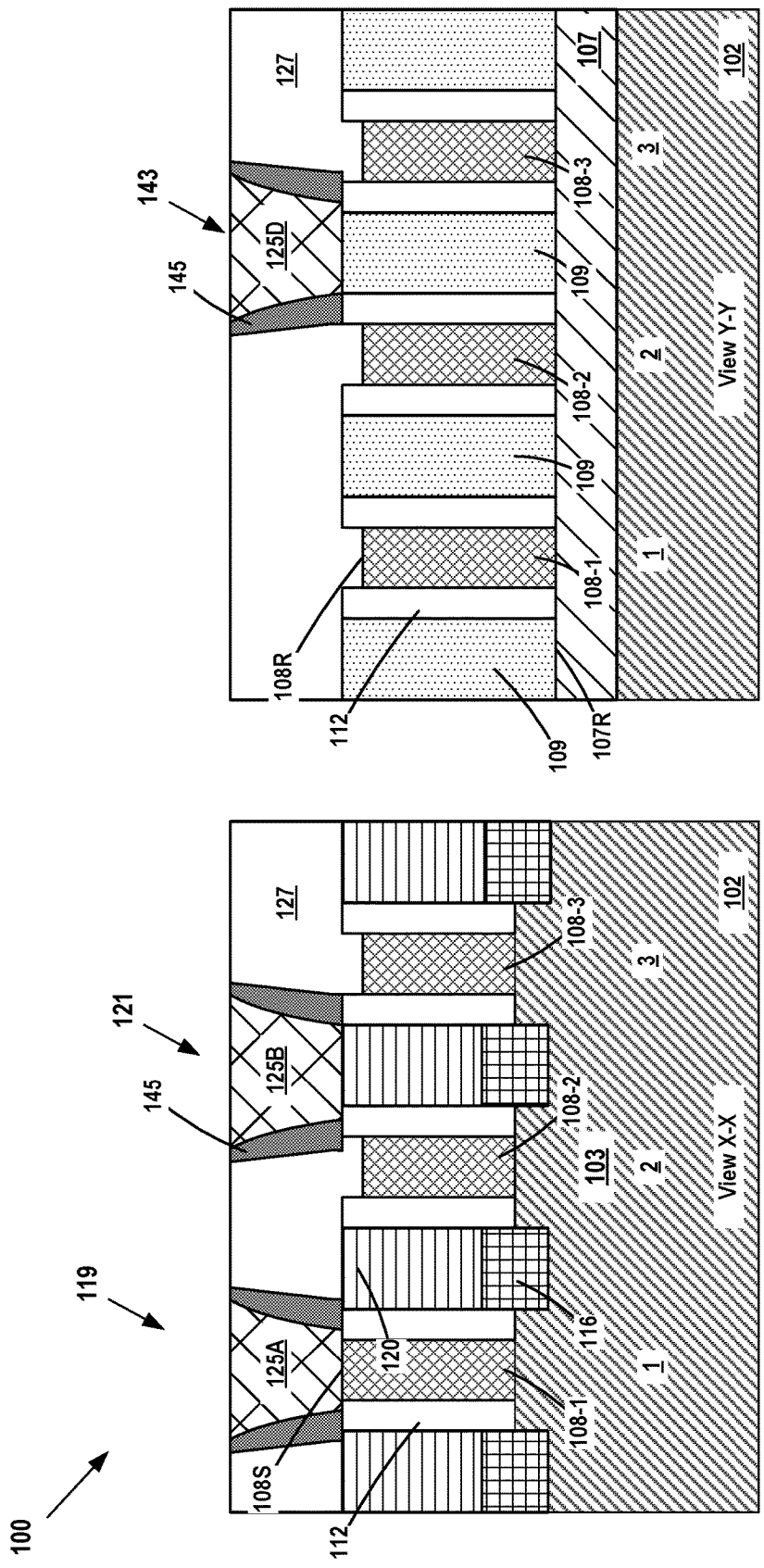

FIG. 17 depicts the product 100 after the above-described at least one layer of insulating material 127 was formed on the product around the spacers 145 and the sacrificial contact structures 125 and after a CMP or etch-back process was performed to remove excess amounts of the at least one layer of insulating material 127 positioned above the upper surfaces of the spacers 145 and the sacrificial contact structures 125.

Figure 18:
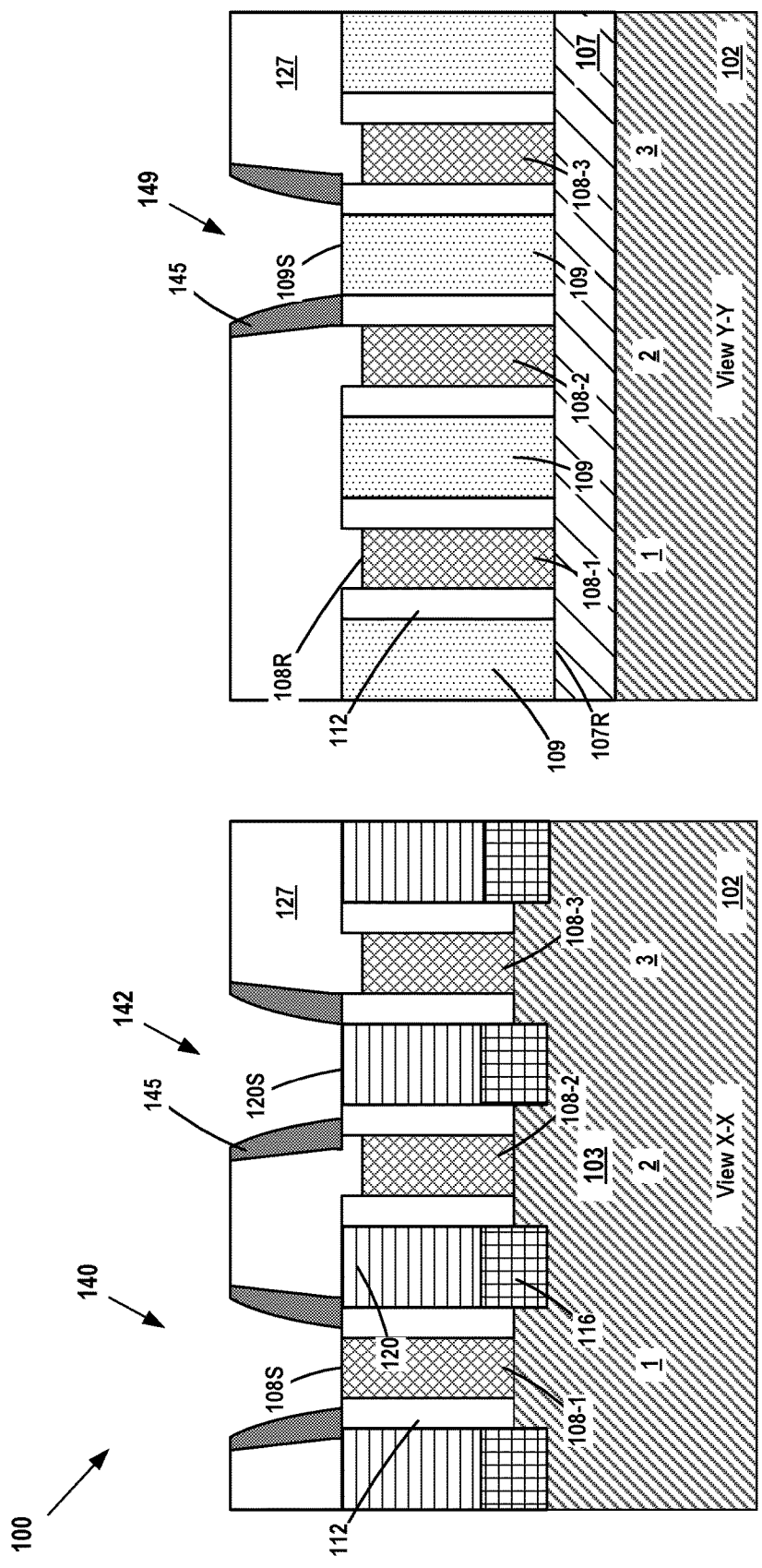

FIG. 18 depicts the product 100 after one or more etching processes were performed to remove the sacrificial contact structures 125 selectively relative to the spacers 145 and the layer of insulating material 127. This results in the formation of device level contact openings 140, 142 and 149. As depicted, the device level contact opening 140 exposes the non-recessed upper surface 108S of the gate structure 108-1; the device level contact opening 142 exposes the non-recessed upper surface 120S of the source/drain contact structure 120 positioned between gates 2 and 3; and the device level contact opening 149 exposes the non-recessed upper surface 109S of the insulating material 109 positioned between gates 2 and 3. Note that, in this embodiment, the contact openings 140, 142 and 149 are laterally bounded or defined by the spacers 145.

Figure 19:
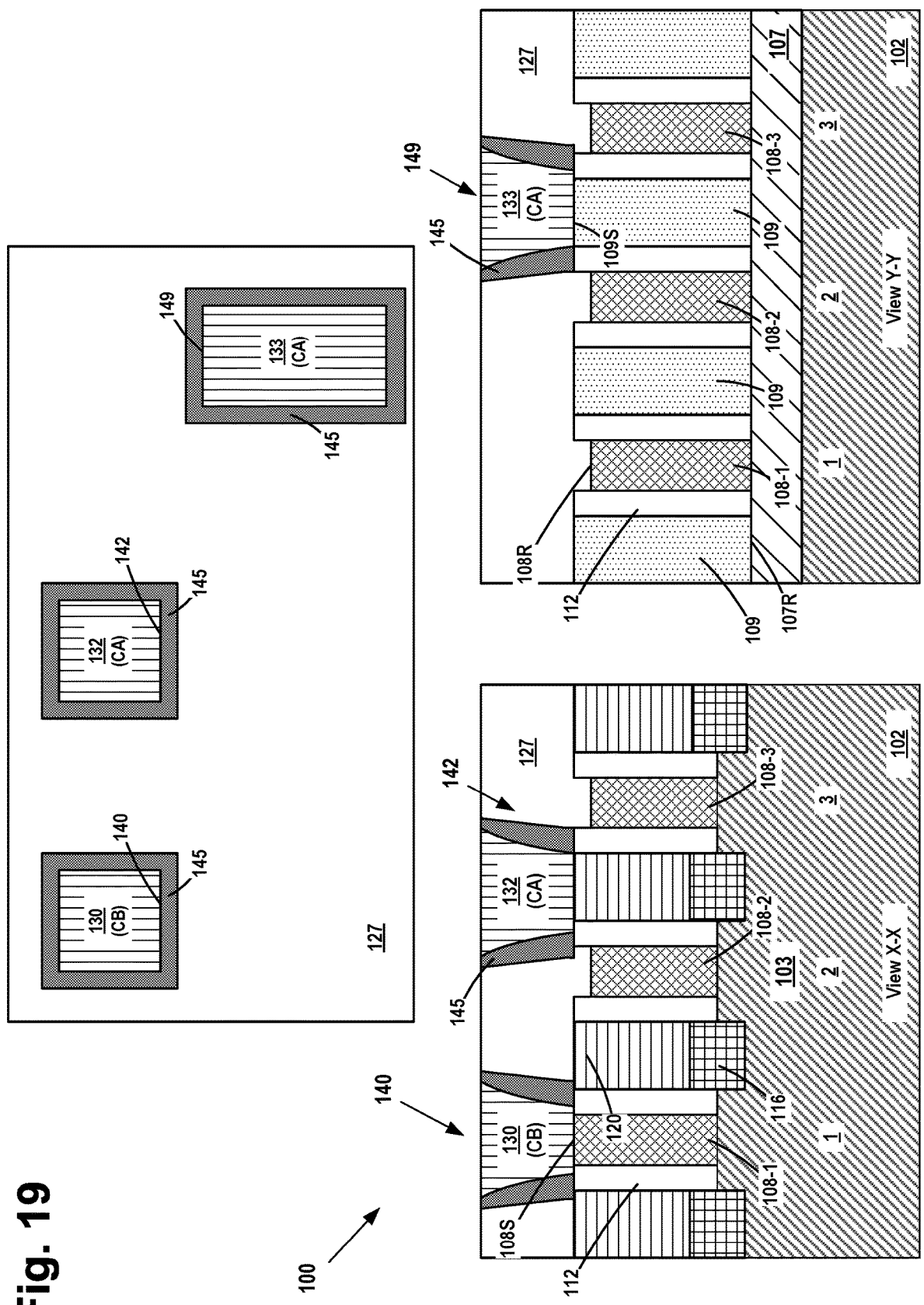

FIG. 19 depicts the product 100 after the above-described process operations were performed to form the CB gate contact structure 130, the CA contact structure 132 and the elongated CA contact structure 133 in the device level contact openings 140, 142 and 149, respectively. FIG. 19 also contains a simplistic plan view (not to scale) showing the contact structures 130, 132 and 133. In this embodiment, as in the previous embodiment, the at least one layer of insulating material 127 is positioned around each of the contact structures 130, 132 and 133. In one particular embodiment, the at least one layer of insulating material 127 physically contacts the spacer 145 positioned around each of the contact structures 130, 132 and 133, while the contact structures 130, 132 and 133 physically contact their respective spacer 145. As noted above, the CB gate contact structure 130 and the CA contact structure 132 as well as the elongated CA contact structure 133 may be comprised of a variety of different materials and they may be formed by various manufacturing techniques. As depicted, the CB contact 130 is positioned above the active region and conductively contacts the gate structure 108-1 of gate 1; the CA contact structure 132 conductively contacts the source/drain contact structure 120 positioned laterally between gates 2 and 3; and the elongated CA contact structure 133 conductively contacts the source/drain contact structure 120 between gates 2 and 3 of the lower transistor shown in FIG. 11. As before, the CB gate contact 130 is positioned entirely above the active region of the transistor. Also note that the elongated CA contact structure 133 lands on the upper surface 109S of the insulating material 109 positioned between gates 2 and 3. At this point in the illustrative process flow depicted herein, a gate contact structure has not yet been formed to the gate structure 108-3 of gate 3. Note that, in this embodiment, the contact openings 140, 142 and 149 are laterally bounded or defined by the spacers 145.

FIG. 20 depicts the product 100 after several process operations were performed. First, one or more recess etching processes were performed to recess the CB gate contact structure 130, the CA contact structure 132 and the elongated CA contact structure 133 such that, at the conclusion of the recess etching process, they each have a recessed upper surface 164 and a contact recess is formed above each of the structures 130, 132 and 133. The amount of recessing may vary depending upon the particular application (e.g., 15-30 nm). Next, a contact cap 151 was formed in the contact recess above each of the CB gate contact structure 130, the CA contact structure 132 and the elongated CA contact structure 133. In one illustrative embodiment, each of the contact caps 151 physically contacts its respective spacer 145. The contact caps 151 may be made of a variety of different materials, e.g., silicon dioxide, silicon nitride, SiNC, SiN, SiCO, SiNOC, etc., and they may be formed using a variety of techniques. In one illustrative process flow, the material for the contact caps 151 was deposited so as to over-fill the spaces or recesses above the recessed upper surfaces 164 of the CB gate contact structure 130, the CA contact structure 132 and the elongated CA contact structure 133. Thereafter, a CMP or etch-back process was performed to remove excess amounts of the material for the contact caps 151 positioned above the upper surface of the at least one layer of insulating material 127. Note that, after formation of the contact caps 151, each of the CB gate contact structure 130, the CA contact structure 132 and the elongated CA contact structure 133 are effectively encapsulated by the combination of the contact cap 151, the sidewall spacer 145 and the materials underlying the CB gate contact structure 130, the CA contact structure 132 and the elongated CA contact structure 133, such as portions of the spacers 112 and, in the case of the elongated CA contact structure 133, by the underlying insulating material 109.

Figure 21:
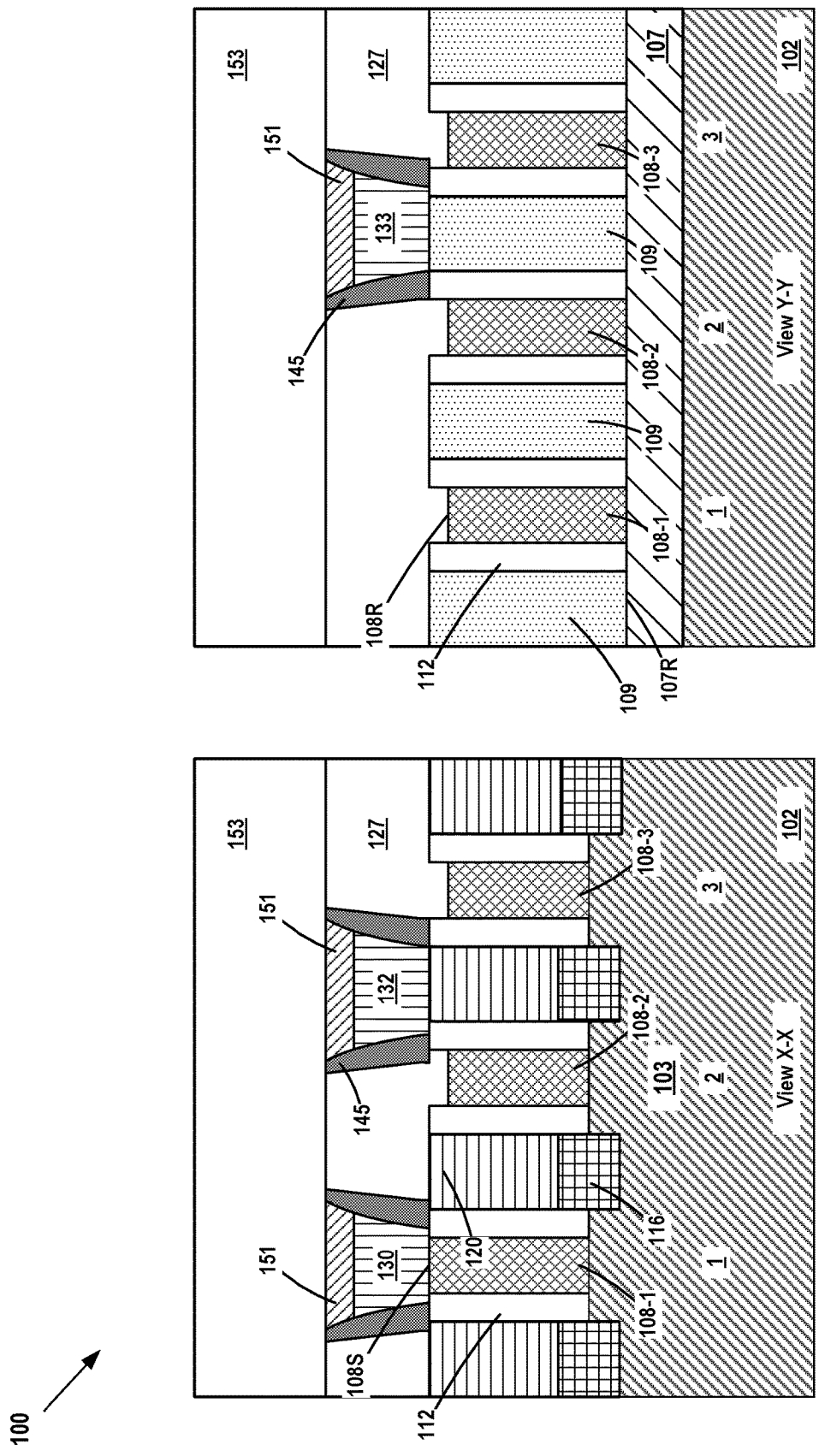

FIG. 21 depicts the product 100 after at least one layer of insulating material 153 was formed above the insulating material 127. The at least one layer of insulating material 153 may be formed to any desired thickness and it may be comprised of a variety of different materials, e.g., silicon dioxide, a low-k oxide (k value less than 3.9), etc. In one illustrative embodiment, the at least one layer of insulating material 153 may be made of the same material(s) as that of the at least one layer of insulating material 127, but that may not be the case in all applications.

Figure 22:
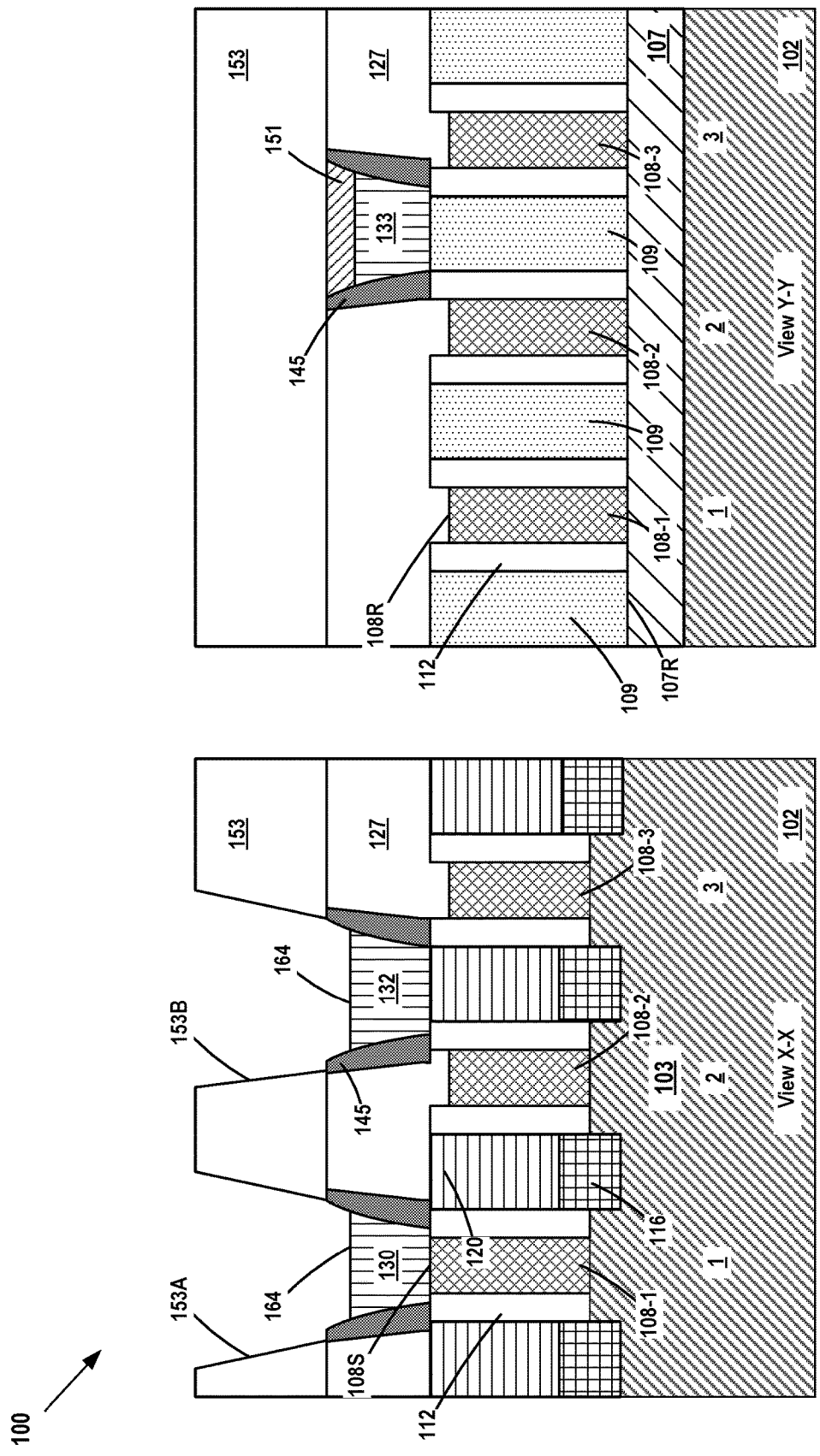

FIG. 22 depicts the product 100 after several process operations were performed. First, one or more etching processes were performed through a patterned etch mask (not shown), e.g., a patterned layer of photoresist, to form openings 153A, 153B in the at least one layer of insulating material 153. The openings 153A, 153B expose at least a portion of the contact caps 151 above the CB gate contact structure 130 and the CA contact structure 132 (see view X-X). Then, an etching process was performed to remove at least a portion (and perhaps all) of the contact cap 151 positioned above each of the contact structures 130 and 132 relative to the surrounding materials. These process operations expose at least a portion of the recessed upper surfaces 164 of the CB gate contact structure 130 and the CA contact structure 132. At that point, the patterned etch mask was removed. It should also be noted that another opening (not shown) that is similar to the openings 153A, 153B is formed in the insulating material 153 at a location (not shown in the cross-sectional view shown in FIG. 22) at the same time as openings 153A, 153B to expose a portion of contact cap 151 positioned above the elongated CA contact structure 133. Thereafter, at least a portion of the contact cap 151 positioned above the elongated CA contact structure 133 was also removed at the same time the contact caps 151 (or at least a portion of the contact caps 151) were removed from above the contact structures 130, 132.

Figure 23:
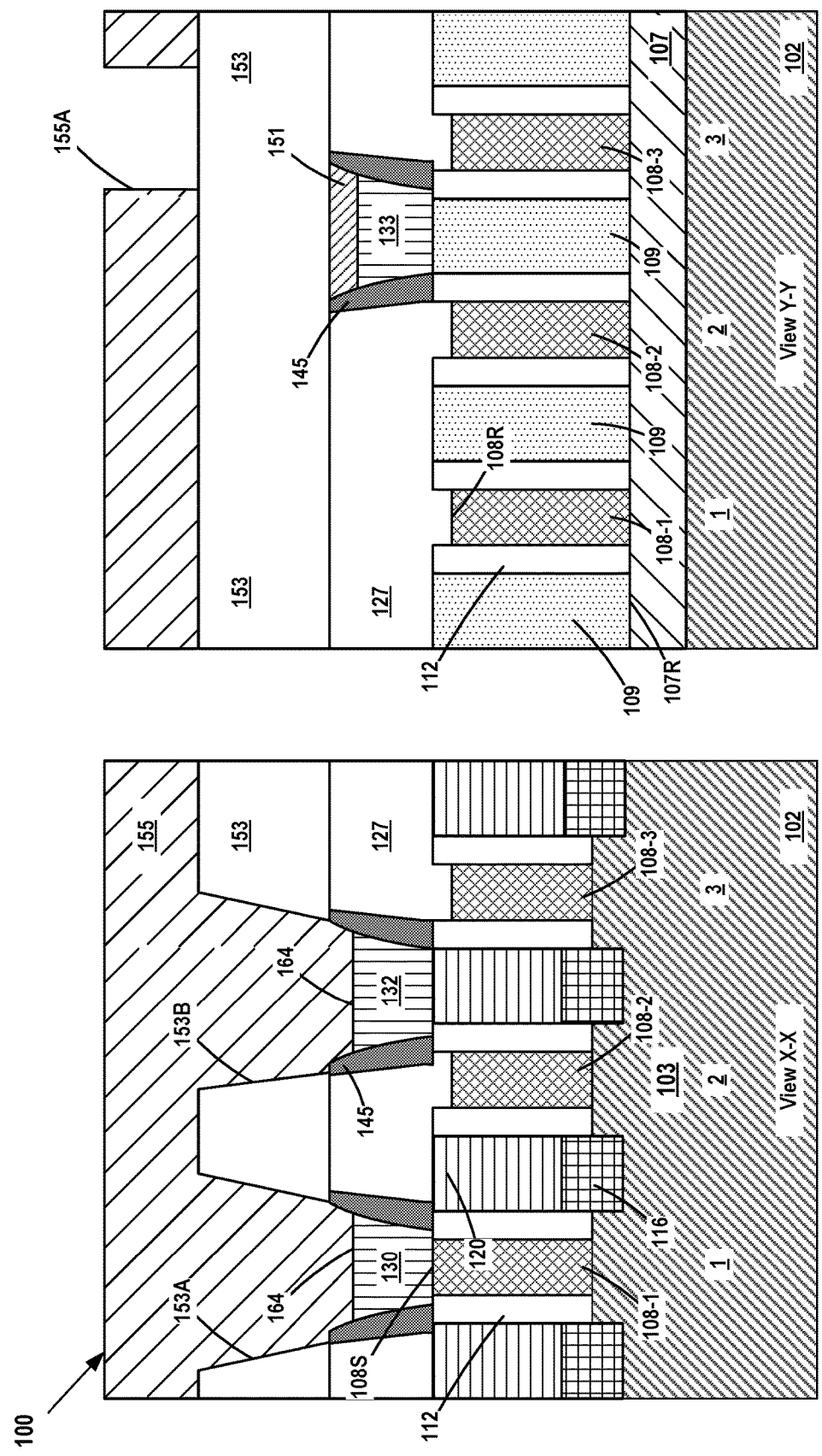

FIG. 23 depicts the product 100 after a patterned CB (gate contact) etch mask 155, (e.g., photoresist, OPL) was formed above the at least one layer of insulating material 153. The patterned CB etch mask 155 fills the openings 153A, 153B and covers exposed portions of the CB gate contact structure 130 and the CA contact structure 132. The patterned CB etch mask 155 also covers the exposed portion (not shown in the cross-sectional views in FIG. 23) of the elongated CA contact structure 133. The CB etch mask 155 comprises an opening 155A that is positioned above a location where a gate contact structure will be formed to contact the gate structure 108-3 of gate 3.

Figure 24:
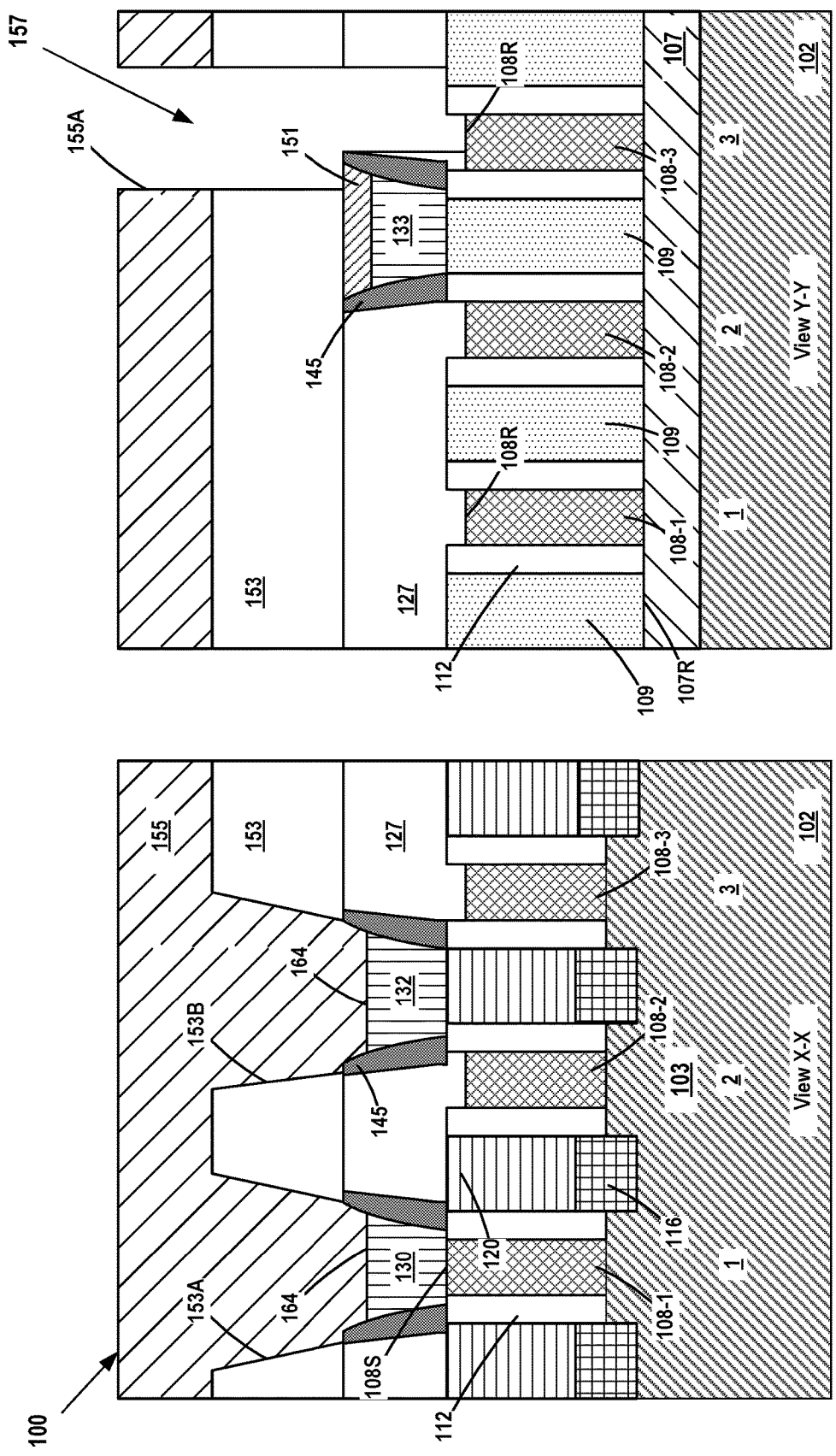

FIG. 24 depicts the product 100 after one or more etching processes were performed through the CB etch mask 155 to remove portions of the layers of insulating material 153 and 127 so as to thereby form a CB gate contact opening 157 that exposes a portion of the recessed upper surface 108R of the gate structure 108-3. Note that, during the formation of the CB gate contact opening 157, the encapsulated elongated CA contact structure 133 is not attacked during this etching process. Although some of the contact cap 151 and the sidewall spacer 145 may be consumed when etching the CB gate contact opening 157, enough of these insulating materials remain in place such that the elongated CA contact structure 133 will not conductively contact the conductive structure that will be formed in the CB gate contact opening 157.

Figure 25:
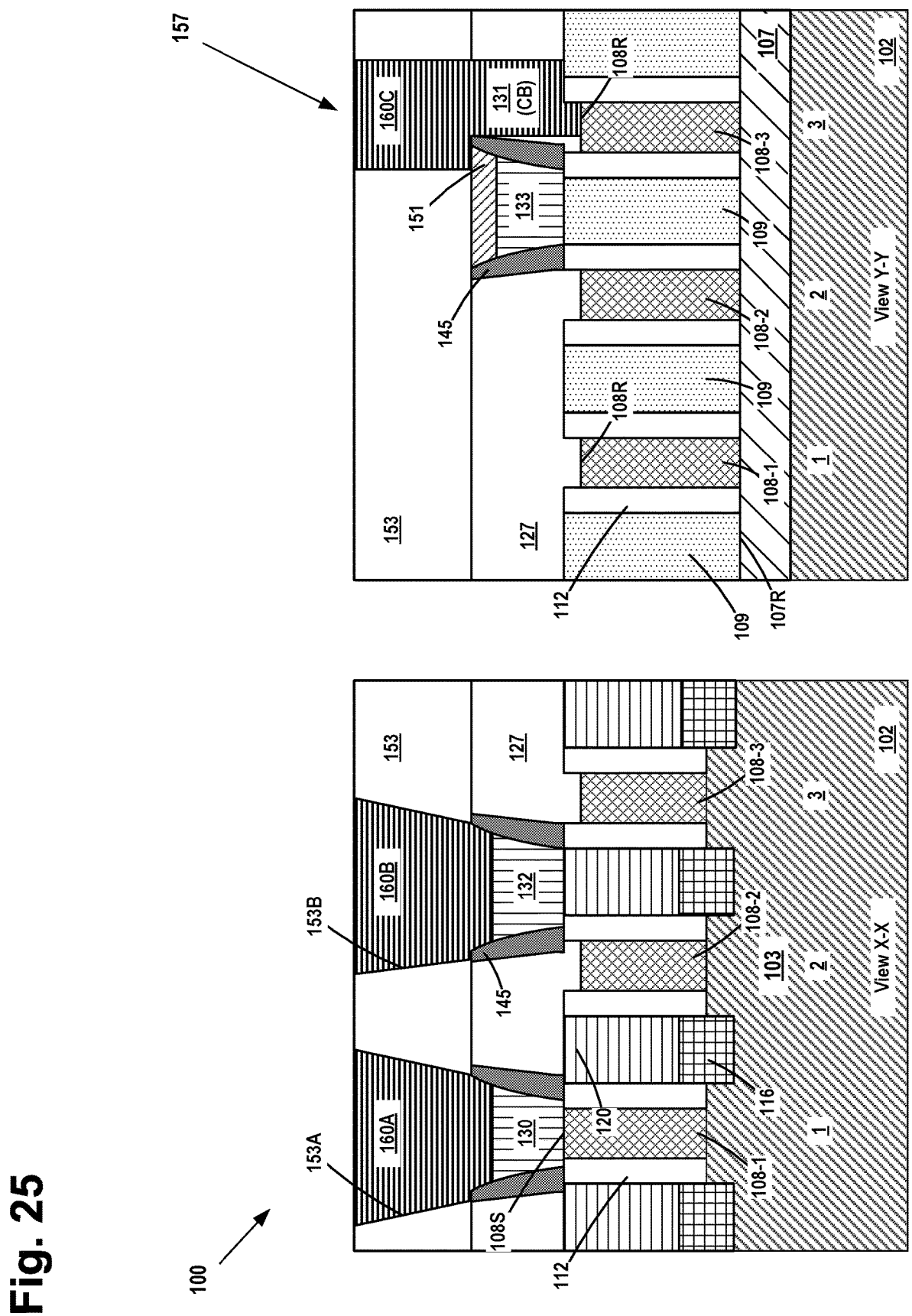

FIG. 25 depicts the product after several process operations were performed. First, the CB etch mask 155 was removed. Then, conductive structures 160A, 160B and 160C (collectively referenced using the numeral 160) were formed in the openings 153A, 153B and the CB gate contact opening 157, respectively. In one illustrative embodiment, the conductive structures 160A, 160B and 160C may be conductive vias that are formed as part of a metallization layer, e.g., M1/V0, for the product 100. Note that the conductive structures 160A, 160B have a relatively shorter vertical height than does the conductive structure 160C. In one illustrative embodiment, the taller conductive structure 160C (e.g., via) may be about 20-60 nm taller than the conductive structures 160A, 160B. In effect, the taller conductive structure 160C functions as the CB gate contact structure 131 that conductively contacts the gate structure 108-3. The conductive structures 160A, 160B conductively contact the CB gate contact structure 130 and the CA contact structure 132, respectively. Another relatively shorter conductive structure (not shown) that is similar in size to the shorter conductive structures 160A, 160B is formed at a location (not shown in the cross-sectional view shown in FIG. 25) at the same time as the other conductive structures 160 so as to establish electrical contact with the elongated CA contact structure 133. The conductive structures 160 may be made of any desired material, e.g., copper, tungsten, etc., and they may be formed using traditional manufacturing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A transistor device, comprising:
a gate structure positioned above at least an active region, the gate structure having an axial length in a direction corresponding to a gate width direction of the transistor device, a first portion of the axial length of the gate structure having a first upper surface and a second portion of the axial length of the gate structure having a second upper surface, wherein the first upper surface is positioned at a level that is above a level of the second upper surface; and
a gate contact structure that contacts the first upper surface of the gate structure.

2. The transistor device of claim 1, further comprising:
a source/drain contact structure positioned adjacent the gate structure and conductively coupled to a source/drain region of the transistor device, the source/drain contact structure having an axial length in a direction corresponding to the gate width direction of the transistor device, a first portion of the axial length of the source/drain contact structure having a third upper surface and a second portion of the axial length of the source/drain contact structure having a fourth upper surface, wherein the third upper surface is positioned at a level that is above a level of the fourth upper surface; and
a contact structure that contacts the third upper surface of the source/drain contact structure.

3. The transistor device of claim 2, wherein the first upper surface and the third upper surface are positioned at approximately the same level.

4. The transistor device of claim 3, wherein the second upper surface and the fourth upper surface are positioned at approximately the same level.

5. The transistor device of claim 1, wherein, when viewed from above, the gate contact structure has a substantially rectangular configuration.

6. The transistor device of claim 1, wherein the gate contact structure is positioned above the active region.

7. The transistor device of claim 1, further comprising:
at least one layer of insulating material positioned above the gate structure;
an opening in the at least one layer of insulating material; and
an internal sidewall spacer positioned within the opening, wherein a portion of the first surface is exposed within the internal sidewall spacer and wherein the gate contact structure is positioned within the internal sidewall spacer, the internal sidewall spacer laterally surrounding the gate contact structure.

8. The transistor device of claim 7, wherein the internal sidewall spacer physically contacts and engages the gate contact structure.

9. A transistor device, comprising:
a gate structure positioned above at least an active region, the gate structure having an axial length in a direction corresponding to a gate width direction of the transistor device, a first portion of the axial length of the gate structure having a first upper surface and a second portion of the axial length of the gate structure having a second upper surface, wherein the first upper surface is positioned at a level that is above a level of the second upper surface;
a gate contact structure positioned entirely above the active region, the gate contact structure contacting the first upper surface of the gate structure;
a source/drain contact structure positioned adjacent the gate structure and conductively coupled to a source/drain region of the transistor device, the source/drain contact structure having an axial length in a direction corresponding to the gate width direction of the transistor device, a first portion of the axial length of the source/drain contact structure having a third upper surface and a second portion of the axial length of the source/drain contact structure having a fourth upper surface, wherein the third upper surface is positioned at a level that is above a level of the fourth upper surface; and
a contact structure that contacts the third upper surface of the source/drain contact structure.

10. The transistor device of claim 9, wherein the first upper surface and the third upper surface are positioned at approximately the same level.

11. The transistor device of claim 10, wherein the second upper surface and the fourth upper surface are positioned at approximately the same level.

12. The transistor device of claim 10, further comprising:
at least one layer of insulating material positioned above the gate structure;
an opening in the at least one layer of insulating material; and
an internal sidewall spacer positioned within the opening, wherein a portion of the first surface is exposed within the internal sidewall spacer and wherein the gate contact structure is positioned within the internal sidewall spacer, the internal sidewall spacer laterally surrounding the gate contact structure.

13. The transistor device of claim 12, wherein the internal sidewall spacer physically contacts and engages the gate contact structure.

14. A device, comprising:
a gate structure for a transistor device;
at least one layer of insulating material positioned above the gate structure, the at least one layer of insulating material having an opening formed therein and an upper surface that is positioned at a first level;
an internal sidewall spacer positioned within the opening;
a conductive member positioned within the internal sidewall spacer, the conductive member having an axial length and a recessed upper surface that is positioned at a second level that is below the first level;
an insulating contact cap positioned above the recessed upper surface of the conductive member, the insulating contact cap being positioned above a first portion of the axial length of the conductive member while a second portion of the axial length of the conductive member is not covered by the insulating contact cap; and
a gate contact structure that conductively contacts the gate structure, wherein at least a portion of the gate contact structure is positioned vertically above at least one of the internal sidewall spacer or the insulating contact cap.

15. The device of claim 14, wherein the axial length of the conductive member extends in a direction corresponding to a gate width direction of the transistor device.

16. The device of claim 14, wherein at least a portion of the gate contact structure physically contacts and engages at least one of the internal sidewall spacer or the insulating contact cap.

17. The device of claim 14, wherein the conductive member has a bottom surface that is positioned at a level that is above a level of an upper surface of the gate structure.

18. The device of claim 17, wherein at least a portion of the internal sidewall spacer is positioned vertically above a sidewall spacer positioned adjacent the gate structure.

19. The device of claim 14, wherein the insulating contact cap has an upper surface that is substantially co-planar with the upper surface of the at least one layer of insulating material.

20. The device of claim 14, wherein the conductive member is conductively coupled to a source/drain region of the transistor device.

* * * * *